(12) United States Patent
Kamijima et al.

(10) Patent No.: US 7,088,417 B2
(45) Date of Patent: Aug. 8, 2006

(54) ELECTROOPTIC DEVICE, METHOD OF MANUFACTURING THE SAME, AND ELECTRONIC APPARATUS

(75) Inventors: Motohiro Kamijima, Nagano-ken (JP); Chihiro Tanaka, Matsumoto (JP); Tadashi Tsuyuki, Nagano (JP); Kenichi Honda, Nagano (JP); Hideki Kaneko, Shiojiri (JP); Shoji Hinata, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 10/123,079

(22) Filed: Apr. 15, 2002

(65) Prior Publication Data

US 2002/0163611 A1 Nov. 7, 2002

(30) Foreign Application Priority Data

| Apr. 16, 2001 | (JP) | ..................................... 2001-117463 |
| May 17, 2001 | (JP) | ..................................... 2001-148298 |
| May 17, 2001 | (JP) | ..................................... 2001-148299 |
| Apr. 2, 2002 | (JP) | ..................................... 2002-100569 |

(51) Int. Cl.
*G02F 1/1345* (2006.01)

(52) U.S. Cl. ..................... 349/152; 349/149; 349/151; 349/153

(58) Field of Classification Search ................ 349/139, 349/140–143, 149, 151, 152, 153
See application file for complete search history.

(56) References Cited

U.S. PATENT DOCUMENTS

| 4,457,589 A | | 7/1984 | Tamura et al. |
| 4,640,583 A | | 2/1987 | Hoshikawa et al. |
| 5,042,917 A | * | 8/1991 | Fujita et al. ................... 349/50 |
| 5,684,555 A | | 11/1997 | Shiba et al. |
| 5,706,069 A | * | 1/1998 | Hermens et al. ............. 349/153 |
| 5,953,094 A | | 9/1999 | Matsuoka et al. |
| 6,323,930 B1 | * | 11/2001 | Higuchi et al. .............. 349/152 |
| 6,473,147 B1 | * | 10/2002 | Nakahara et al. ........... 349/153 |

FOREIGN PATENT DOCUMENTS

| CN | 1276622 A | 12/2000 |
| EP | 1 041 641 A2 | 3/2000 |
| JP | 57-101883 | 6/1982 |
| JP | 60-26321 | 2/1985 |
| JP | 62-218937 | 9/1987 |
| JP | 07-270811 | 10/1995 |
| JP | 10-325951 | 12/1998 |
| JP | 11-101984 | 4/1999 |
| JP | 11-109886 | 4/1999 |
| JP | 11-133454 | 5/1999 |

(Continued)

OTHER PUBLICATIONS

Communication from Japanese Patent Office re: counterpart application 2002–100569.

(Continued)

*Primary Examiner*—Andrew Schechter
*Assistant Examiner*—Michael H Caley
(74) *Attorney, Agent, or Firm*—Harness, Dickey & Pierce, P.L.C.

(57) ABSTRACT

An electrooptic device includes a first substrate 10, wiring 16 provided along one side of the first substrate 10 to extend to another side crossing the one side, and a coating layer 30 coating the wiring 16. Conceivable examples of the electrooptic device include a liquid crystal device, and an EL device. In the liquid crystal device, the coating layer 30 can be formed by a sealing material for bonding together the first substrate 10 and a second substrate 20 opposed to each other. The wiring 16 is coated with the coating layer 30 to be cut off from contact with the outside air.

20 Claims, 27 Drawing Sheets

FOREIGN PATENT DOCUMENTS

| | | |
|---|---|---|
| JP | 11-142865 | 5/1999 |
| JP | 11-190852 | 7/1999 |
| JP | 11-288001 | 10/1999 |
| JP | 2000-221537 | 8/2000 |
| JP | 2001-075118 | 3/2001 |
| JP | 2001-083504 | 3/2001 |
| WO | WO 9812597 A1 * | 3/1998 |
| WO | WO 9952011 A1 * | 10/1999 |
| WO | WO99/52011 | 10/1999 |

OTHER PUBLICATIONS

Communication from Japanese Patent Office re: counterpart application 2002–100570.

Communication from European Patent Office regarding counterpart application.

Patent Abstract of Japan 2001–075118.

Communication from Chinese Patent Office re: counterpart application.

* cited by examiner

FIG. 2
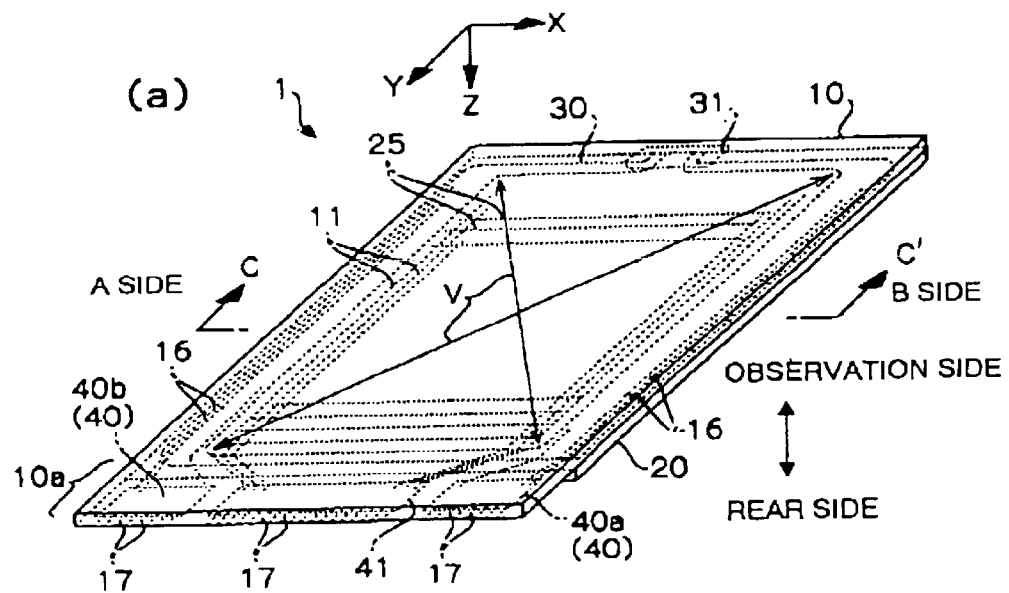
(a)
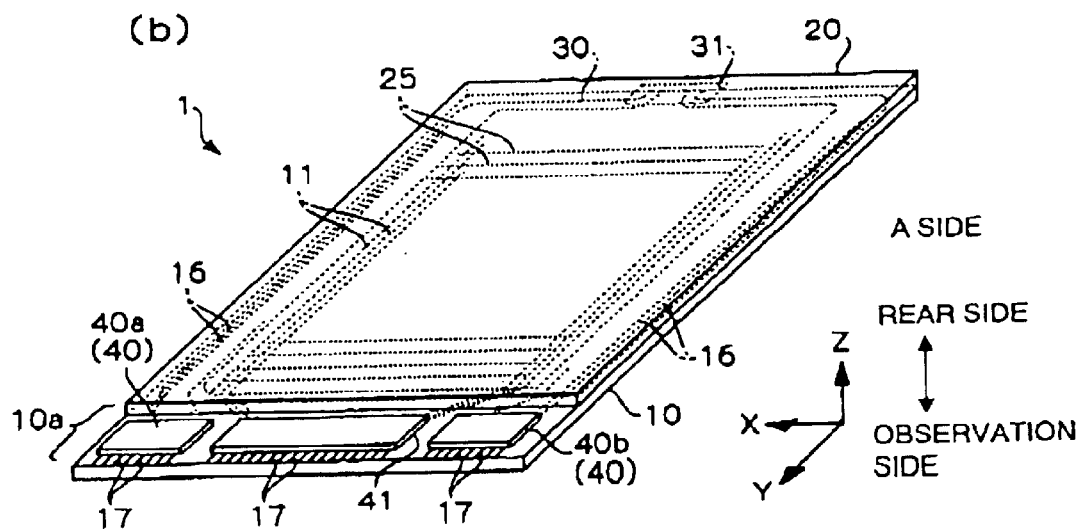
(b)

FORMATION REGION OF DISPLAY AREA V

F-F' SECTION OF FIG. 10(c1)

FIG. 16
(a)
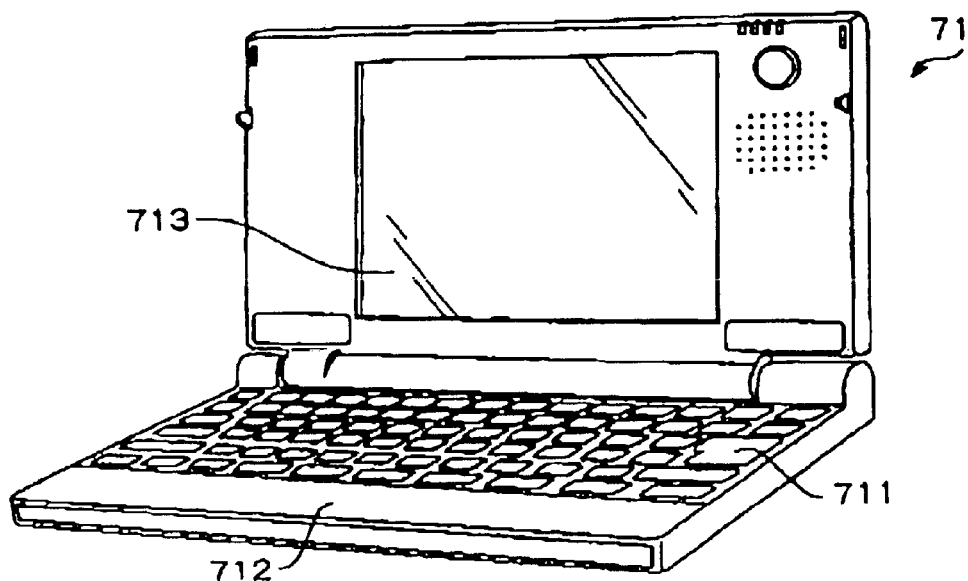
(b)
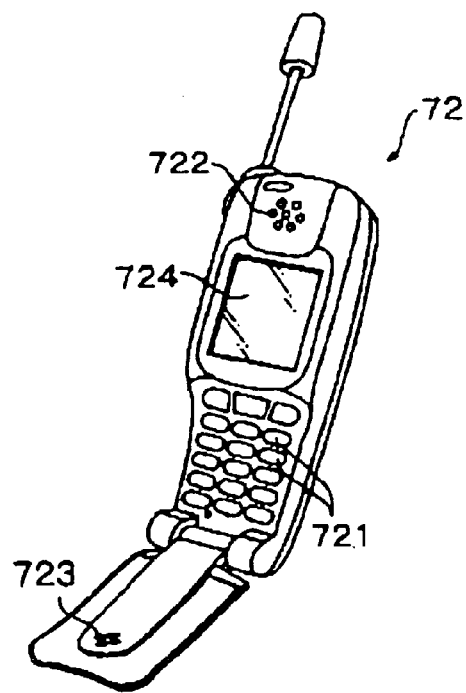

ELECTROOPTIC DEVICE, METHOD OF MANUFACTURING THE SAME, AND ELECTRONIC APPARATUS

BACKGROUND OF THE INVENTION

1. Technical Field of the Invention

The present invention relates to an electrooptic device such as a liquid crystal device, an EL (Electro Luminescence) device, or the like, and a method of manufacturing the electrooptic device, and an electronic apparatus comprising the electrooptic device.

2. Description of the Related Art

In recent years, liquid crystal devices have been widely used as display sections for displaying information in electronic apparatuses such as a cellular phone, a portable information terminal device, a personal computer, etc. Also, EL devices as well as liquid crystal devices will be possibly used in future.

A known liquid crystal device comprises a pair of substrates bonded together through a sealing material, a liquid crystal sandwiched between both substrates, and an electrode for applying a voltage to the liquid crystal. Furthermore, wiring is formed in a region (i.e., a projecting region) of one of the substrates, which projects outward beyond the other substrate, and terminals of various mounted parts are connected to an end of the wiring so that a voltage is supplied to the electrode through the wiring.

Conceivable examples of the mounted parts include IC chips mounted on the projecting region by a COG (Chip On Glass) technique, FPC for connecting an external apparatus such as a circuit board or the like to the liquid crystal device, and the like.

However, the wiring formed on the projecting region is exposed to the air, and thus moisture in the air easily adheres to the wiring, thereby easily causing corrosion of the wiring. The corrosion of the wiring makes incomplete conduction between the wiring and the terminals of the mounted parts, thereby causing the problem of deteriorating reliability of the liquid crystal device.

Furthermore, when moisture and electrically conductive impurities adhere across adjacent wirings, the wirings are possibly short-circuited. In order to prevent the short circuit, the interval of the wirings must be increased. In this case, a wide space must be secured for forming the wirings, thereby causing difficulties in complying with demands for miniaturization of the liquid crystal device. Therefore, a conventional liquid crystal device causes various problems due to exposure of wirings to the air.

The present invention has been achieved in consideration of the above-described problems, and an object of the present invention is to simply and effectively prevent various problems due to exposure of wirings to the air.

SUMMARY OF THE INVENTION

In order to achieve the object, an electrooptic device of the present invention comprises a first substrate, wiring provided along one side of the first substrate to extend to another side crossing the one side, and a coating layer for coating the wiring.

In this construction, the wiring is coated with the coating layer, and thus adhesion of moisture and electrically conductive impurities to the wiring layer can be prevented. As a result, it is possible to prevent corrosion of the wiring due to adhesion of moisture and the like, and the occurrence of a short circuit between wirings. Therefore, in the electrooptic device of the present invention, various defects due to exposure of the wiring to the air can be simply and effectively prevented.

Also, as described above, the interval of the wirings can be decreased to narrow the area in which the wirings are to be formed, thereby achieving miniaturization of the electrooptic device.

(2) The electrooptic device having the above construction may comprise a second substrate opposed to the first substrate, an electrode formed on the second substrate, and a liquid crystal disposed between the first and second substrates. In this case, the coating layer can be formed by a sealing material formed to surround the liquid crystal, and the wiring can be connected to the electrode. This construction corresponds to a liquid crystal device comprising a pair of substrates bonded together with a sealing material provided therebetween, and a liquid crystal sealed as an electrooptic material in the gap, i.e., the cell gap, between both substrates.

In this construction, the wiring is coated with the sealing material, and thus adhesion of moisture and electrically conductive impurities to the wiring layer can be prevented. As a result, it is possible to prevent corrosion of the wiring due to adhesion of moisture and the like. Also, in a portion of the wirings, which is coated with the coating layer, neither moisture nor electrically conductive impurities adhere over a plurality wirings, thereby preventing the occurrence of a short circuit between the wirings. Therefore, the interval of the wirings can be decreased to narrow the area in which the wirings are to be formed, thereby achieving miniaturization of the electrooptic device.

(3) In the electrooptic device having the above-described construction comprising the sealing material, the second substrate, and the liquid crystal, a plurality of electrodes can be provided, and a plurality of wirings can be provided to be respectively electrically connected to the plurality of electrodes. In this case, at least one of the wirings can be electrically connected to the corresponding electrode on one of the sides of the first substrate. Furthermore, the other wirings of the plurality of wirings can be electrically connected to the corresponding electrodes on the side opposite to the one side.

Namely, in the electrooptic device of the present invention, conduction between the wirings and the electrodes can be attained at two positions on the right and left sides, or the upper and lower sides of the sealing material. This permits stable driving of each pixel or each display dot, as compared with a case in which conductive between wirings and electrodes is attained on only one side of a sealing material.

(4) In the electrooptic device having the above construction, an end of the wiring can be connected to an external connection circuit. In this case, an output signal of the external connection circuit can be transmitted to the electrode through the wiring.

(5) In the electrooptic device having the above construction comprising the sealing material, a conductive material can be contained in the sealing material so that the wiring can be connected to the electrode through the conductive material. In this case, mounted parts to be connected to the electrode, for example, driving IC, FPC (Flexible Printed Circuit), and the like, and the electrode need not be mounted on the same substrate. Namely, the mounted parts may be mounted on only one of the pair of substrates, thereby achieving the simplification of the construction and a reduction of manufacturing cost.

Since the wiring is electrically connected to the electrode through conductive particles dispersed in the sealing material, the electrode and the wiring of both substrates can be electrically connected by bonding together both substrates with the sealing material, thereby eliminating the need for a special structure for conduction. Therefore, the construction can be further simplified, and the manufacturing cost can be further decreased.

(6) The electrooptic device having the above construction may further comprise a thin film diode comprising a first metal film, an insulating film and a second metal film, which are laminated on the first substrate. In this case, the wiring can be formed by using the same layer as at least one of the first metal film and the second metal film.

Therefore, when the thin film diode element and the wiring are formed by using a common layer, the wiring can be formed at the same time as the step of forming the thin film diode, thereby achieving the simplification of the manufacturing process as compared with a case in which the wiring forming step is separately performed.

(7) The electrooptic device having the structure using the thin film diode may further comprise a pixel electrode connected to the thin film diode. In this case, the wiring can be formed by using the same layer as at lease one of the first metal film, the second metal film, and the pixel electrode. This can achieve the simplification of the manufacturing process as compared with the case in which the wiring forming step is separately performed.

(8) The electrooptic device having the above construction may further comprise wiring formed on the second substrate. In this case, the wiring can comprise a coated portion coated with a side of the sealing material and extended in substantially the same direction as the side. Namely, the wiring coated with the coating layer can be provided not only on the first substrate but also on the second substrate. This can simply and effectively prevent the wiring formed on the second substrate from being exposed to the air.

(9) In the electrooptic device having the above construction, the sealing material can include a portion coating the wiring and a portion not coating the wiring. In this case, the portion coating the wiring can be formed to be wider than the portion not coating the wiring. Namely, in the sealing material, the side of the sealing material, which does not have the portion coating the wiring, can be formed with a minimum necessary width for bonding both substrates together, thereby narrowing the frame region. On the other hand, the side having the portion coating the wiring is formed with a width sufficient not only for bonding together both substrate but also for coating the wiring, and thus various problems due to exposure of the wiring to the air can be resolved.

(10) In the electrooptic device having the structure in which conduction between the pair of substrates is achieved through the conductive material dispersed in the sealing material, the sealing material can be formed to include a conductive portion containing the conductive material, and a nonconductive portion not containing the conductive material so that the wiring is coated with the nonconductive portion.

When the coating layer coating the wiring is formed by using the sealing material containing the conductive material, conductive connection between the electrode and the wiring can be achieved by the conductive material, as described above. However, there is a problem in which when the interval of a plurality of wirings coated with the sealing material is decreased, i.e., when the pitch is narrowed, a short circuit possibly occurs between the wirings.

With respect to this problem, like in the above construction, when the sealing material comprises the conductive portion and the nonconductive portion, no short circuit occurs because the nonconductive portion does not contain the conductive material. Therefore, even when many wirings are arranged at a narrow pitch in the nonconductive portion, no short circuit occurs between the wirings. The sealing material may have a width sufficient only for securely sealing the liquid crystal. Therefore, when the width of the sealing material is appropriately shared between the conductive portion and the nonconductive portion, all wirings with a narrow pitch, which are highly likely to cause a short circuit, can be arranged in the nonconductive portion, thereby securely preventing the occurrence of a short circuit.

(11) In the electrooptic device having the construction in which the sealing material comprises the conductive portion and the nonconductive portion, the wiring can be provided inside the conduction position between the wiring and the electrode. This can eliminate the need to extend the wiring outside the sealing material, and thus eliminate the need to widely project the substrate outward beyond the sealing material, thereby permitting the miniaturization of the electrooptic device.

(12) An electronic apparatus of the present invention comprises the electrooptic device having the above-described construction. The electrooptic device of the present invention can simply and securely prevent various problems due to exposure of lead wiring to the air, thereby permitting a good display for a long period of time. Therefore, the electronic apparatus comprising the electrooptic device can also sufficiently display information about the electronic apparatus for a long period of time.

(13) A method of manufacturing an electrooptic device of the present invention is a method of manufacturing an electrooptic device comprising a pair of substrates bonded together with a frame-shaped sealing material, and a liquid crystal disposed between the substrates, and comprises a first step of forming wiring on at least one of the pair of substrates, and a second step of bonding together the pair of substrates with the sealing material provided therebetween, wherein the second step comprises bonding together the pair of substrates so that the wiring is partially coated with a side of the sealing material extending in substantially the same direction as the extension direction of a portion of the wiring. In the electrooptic device obtained by this manufacturing method, various problems due to exposure of the wiring to the air can be resolved by the same cause as described above.

(14) In the method of manufacturing an electrooptic device having the above construction, the second step preferably comprises a step of forming, on one of the substrates, the sealing material to coat a portion of the wiring by the side of the sealing material, which extends in substantially the same direction as the extension direction of a portion of the wiring, and a step of bonding together the pair of substrates through the sealing material.

When the sealing material is formed to coat the wiring formed on the substrate, it is possible to prevent the wiring from being exposed to the air even during the time from the formation of the sealing material to bonding of both substrates. Therefore, various problems due to exposure of the wiring to the air can be more securely prevented.

(15) The method of manufacturing an electrooptic device having the above construction may further comprise a step of forming a portion of the sealing material on one of the substrates, and a step of forming the remainder of the sealing material on the other substrate. In this case, in the second step, a portion of the sealing material is connected to the remainder of the sealing material to form the entire sealing material. This method can simply and securely form the sealing material comprising two different portions including a conductive portion and a nonconductive portion.

(16) In the method of manufacturing an electrooptic device having the above construction in which the sealing material comprises the conductive portion and the nonconductive portion, a portion of the sealing material comprises an inner frame portion of the sealing material, and the remaining portion comprises an outer frame portion of the sealing material. In this construction, a small frame portion and a large frame portion are combined, i.e., bonded together, to form the whole sealing material.

(17) In the method of manufacturing an electrooptic device having the above construction, one of a portion of the sealing material and the remainder of the sealing material contains a conductive material, and the other of a of a portion of the sealing material and the remainder of the sealing material contains a nonconductive gap material. In this way, when the remainder of the sealing material contains the nonconductive gap material, it is possible to achieve the function to keep the gap dimension between the pair of substrates constant while preventing a short circuit in the wiring in the remainder of the sealing material.

(18) In the method of manufacturing an electrooptic device having the above construction, a portion of the sealing material and the remainder of the sealing material preferably have an overlap when the pair of substrates is bonded together. This can prevent the occurrence of a gap between a portion of the sealing material and the remainder thereof when both portions are connected to each other.

BRIEF DESCRIPTION OF THE DRAWINGS

FIG. 2 shows an embodiment in which the present invention is applied to a liquid crystal as an example of electrooptic devices, in which FIG. 2(*a*) is a perspective view of the liquid crystal device as viewed from the observation side, and FIG. 2(*b*) is a perspective view showing the liquid crystal device as viewed from the rear side.

FIG. 16 shows electonic apparatuses according to embodiments of the present invention, in which FIG. 16(*a*) is a perspective view showing a personal computer as an example of electronic apparatuses, and FIG. 16(*b*) is a perspective view showing a cellular phone as an example of electronic apparatuses.

Figure 1:
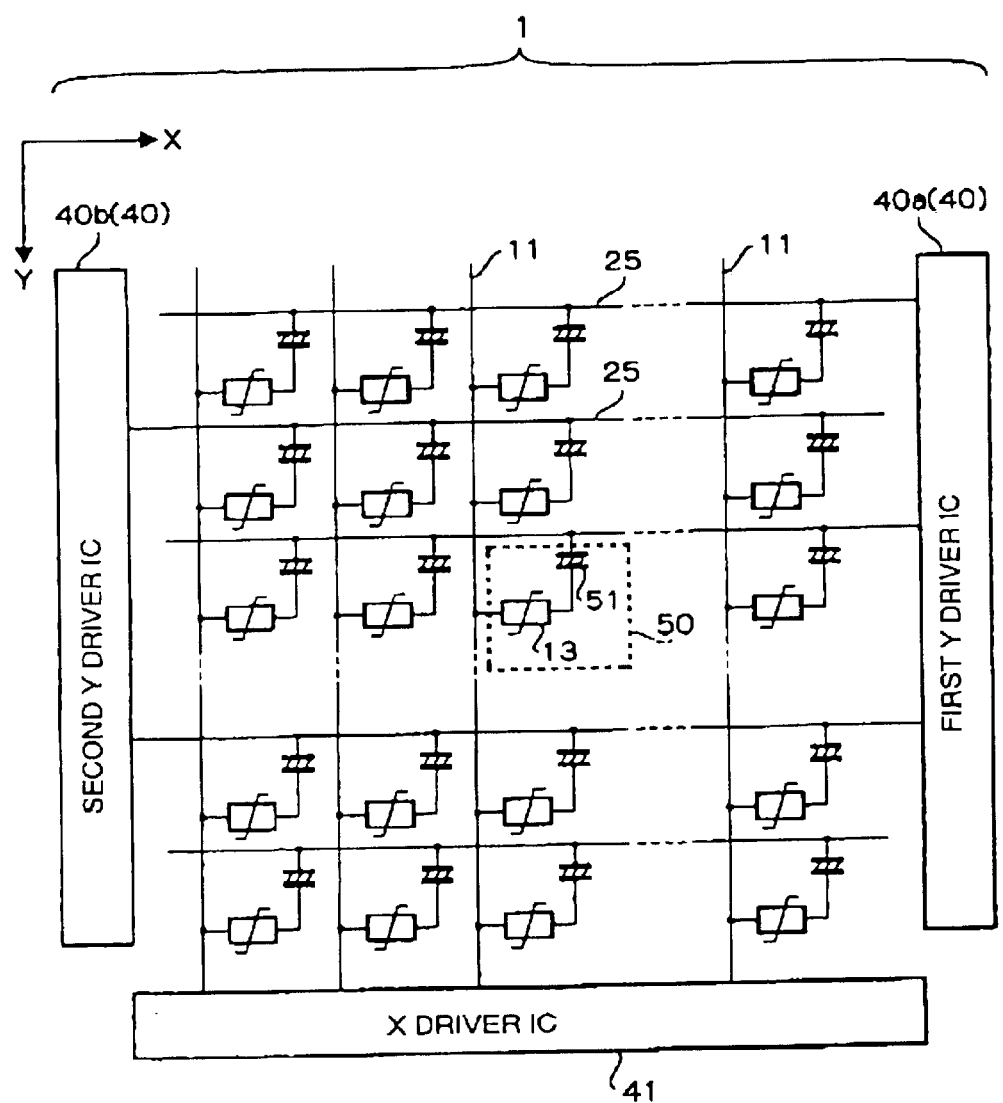
FIG. 1 is a liquid crystal device as an example of electrooptic devices to which the present invention can be applied, and particularly a drawing showing equivalent circuits in the electrical configuration of an active matrix-type liquid crystal device using TFT elements.

DETAILED DESCRIPTION OF THE PREFERRED EMBODIMENTS (Electrooptic Device of First Embodiment)

An embodiment of the present invention will be described below with reference to an example in which the present invention is applied to an active matrix system reflective liquid crystal device comprising a TFD (Thin Film Diode)

element as a switching element, and a liquid crystal as an electrooptic material, and utilizing external light such as sun light, room light, or the like.

In all the drawings, it is desirable to pay attention to the fact that the ratio of the dimensions of a plurality of components of a device is properly changed for making it easy to see the device, and that when the same structure is repeated, the structure is not shown in the drawings.

FIG. 1 is a block diagram showing the electrical configuration of a liquid crystal device according to an embodiment of the present invention. As shown in this figure, a liquid crystal device 1 comprises a plurality of scanning lines 25 extended in the X direction, a plurality of data lines 11 extended in the Y direction perpendicular to the X direction, a plurality of display dots 50 respectively provided at the intersections of the scanning lines 25 and the data lines 11. Each of the display dots 50 comprises a liquid crystal display element 51 and a TFD element 13, which are connected in series. The display dots 50 are arranged in a matrix.

One of the display dots 50 corresponds to a minimum-unit display element for displaying an image. In a color display image formed by combining the three primary colors, R (red), G (green) and B (blue), three display dots 50 of R, G and B are combined to form one pixel. On the other hand, in a monochrome display image, one display dot 50 forms one pixel.

In FIG. 1, of the plurality of scanning lines 25, the scanning lines 25 odd-numbered from above are connected to a first Y driver IC 40a. On the other hand, the scanning lines 25 even-numbered from above are connected to a second Y driver IC 40b. Scanning signals produced from the Y drivers IC40a and 40b are supplied to the scanning lines 25. Hereinafter, when the first Y driver IC 40a and the second Y driver IC 40b need not be discriminated, these driver ICs are simply denoted by "Y driver IC 40".

The plurality of data lines 11 are connected to a X driver IC 41 so that data signals produced by the X driver IC 41 are supplied to the data lines 11. On the other hand, in this embodiment, each of the plurality of dots 50 arranged in a matrix corresponds to any one of the R, G and B colors.

FIG. 2(a) shows the liquid crystal device 1 of this embodiment, as viewed from the observation side, i.e., the side where an observer should be positioned. FIG. 2(b) shows the liquid crystal device 1 as viewed from the rear side, i.e., the side opposite to FIG. 2(a). Hereinafter, as shown in FIGS. 2(a) and 2(b), the negative direction of the X axis is denoted by "A side", and the positive direction is denoted by "B side".

As shown in FIGS. 2(a) and 2(b), the liquid crystal device 1 comprises an element substrate 10 and a counter substrate 20, which are bonded together with a sealing material 30, and a liquid crystal (not shown in FIG. 2) sealed in the region surrounded by both substrates and the sealing material 30. The sealing material is formed in a substantially rectangular frame shape along the periphery of the counter substrate 20, i.e., along the outer periphery. Also, an opening is formed in a portion of the sealing material, for sealing the liquid crystal. After the liquid crystal is sealed in through the opening, the opening is sealed with a sealant 31.

The sealing material 30 contains many electrically conductive particles having electrical conductivity and dispersed therein. The electrically conductive particles are, for example, plastic particles plated with a metal, or electrically conductive resin particles, and have both the function to electrically connecting wirings formed on both the element substrate 10 and the counter substrate 20, and the function as a spacer for keeping the gap between both substrates, i.e., the cell gap, constant. Although, in fact, a polarization plate for polarizing incident light and a reterdation plate for compensating interference colors are bonded to the outer surface of each of the element substrate 10 and the counter substrate 20, these components are neither shown in the drawing nor described below because they are not related directly to the present invention.

Each of the element substrate 10 and the counter substrate 20 comprises a light transmitting plate member, for example, of light transmitting glass, light transmitting quartz, light transmitting plastic, or the like. Of both substrates, the element substrate 10 positioned on the observation side has the plurality of data lines 11 formed on the inner surface, i.e., the liquid crystal-side surface. On the other hand, the counter substrate 20 positioned on the rear side has the plurality of scanning lines 25 formed on the inner surface.

The element substrate 10 has a projecting region 10a projecting outward beyond the counter substrate 20, the projecting region 10a being a region projecting outward from the outer periphery of the sealing material 30, i.e., a region not overlapping the sealing material 30 and the liquid crystal sealed inside the sealing material 30. In the projecting region 10a, the X driver IC 41 is mounted near the center in the X direction. Also, the first Y driver IC 40a and the second Y driver IC 40b are mounted at positions opposite to each other with the X driver IC 41 provided therebetween in the X direction.

Each of the drivers ICs 41, 40a and 40b is mounted on the projecting region 10a by a COG technique. Namely, these driver ICs are bonded to the projecting region 10a of the element substrate 10 by using ACF (Anisotropic Conductive Film) comprising conductive particles dispersed in an adhesive (refer to FIG. 8(b)). Furthermore, a plurality of external connecting terminals 17 are formed at the edge of the projecting region 10a. For example, an end of FPC (Flexible Printed Circuit) (not shown in the drawing) is connected to the portion where the external connecting terminals 17 are formed, and an external apparatus such as a circuit board, or the like is connected to the other end of the FPC. Therefore, a power supply voltage, an electric signal, etc., which are output from the external apparatus, are supplied to the external connecting terminals 17 through the FPC.

The X driver IC 41 produces data signals corresponding to the signal input from the external apparatus through the FPC and the external connecting terminals 17, and outputs the data signals to the data lines 11. On the other hand, Y driver IC 40 produces scanning signals corresponding to the signal input from the external apparatus through the FPC and the external connecting terminals 17, and outputs the scanning signals. The scanning signals are supplied from lead wiring 16 formed on the element substrate 10 to the scanning lines 25 formed on the counter substrate 20 through the conductive particles in the sealing material 30.

Figure 3:
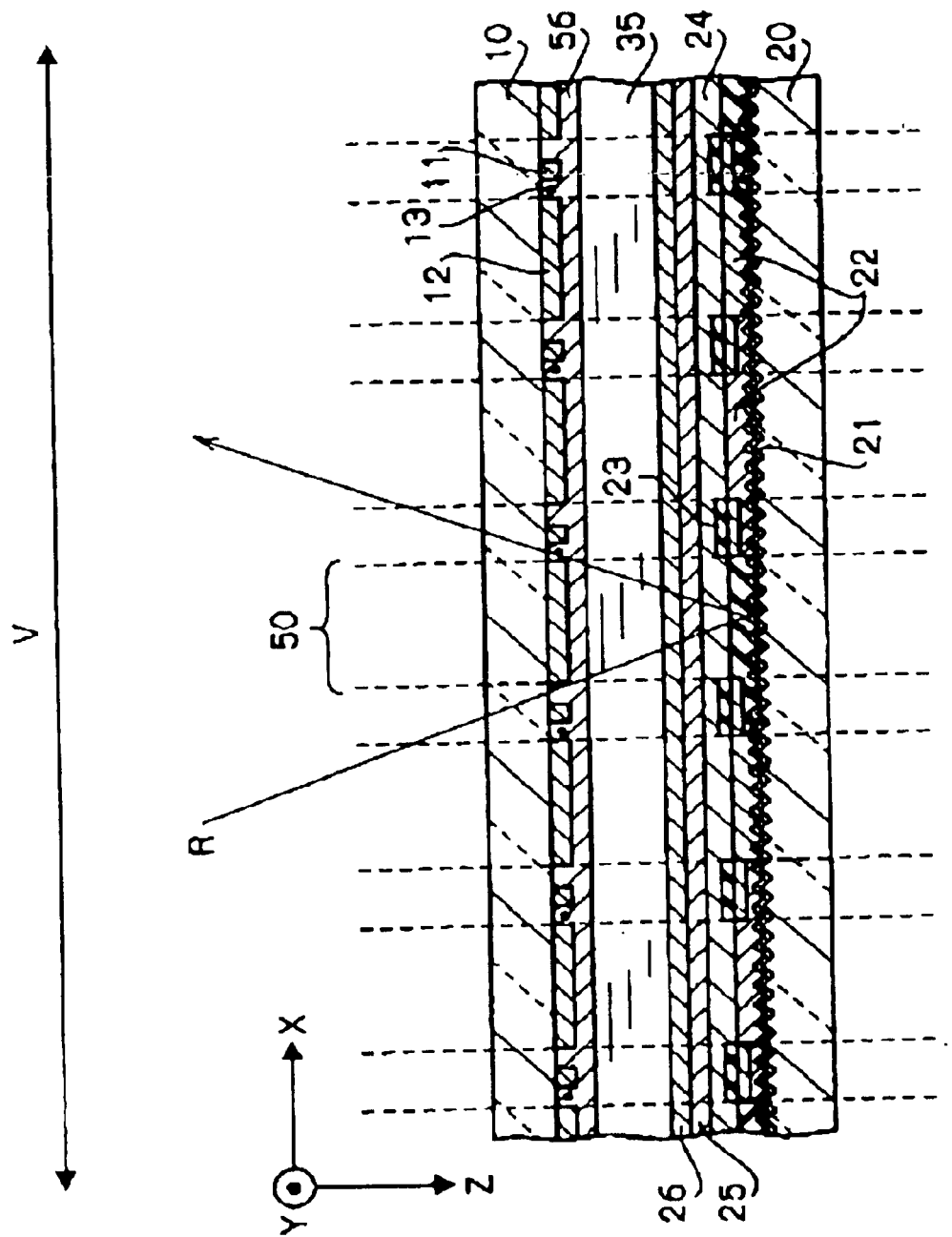
FIG. 3 is a sectional view showing the sectional structure of the liquid crystal device taken along line C–C' in FIG. 2(*a*).
Figure 4:
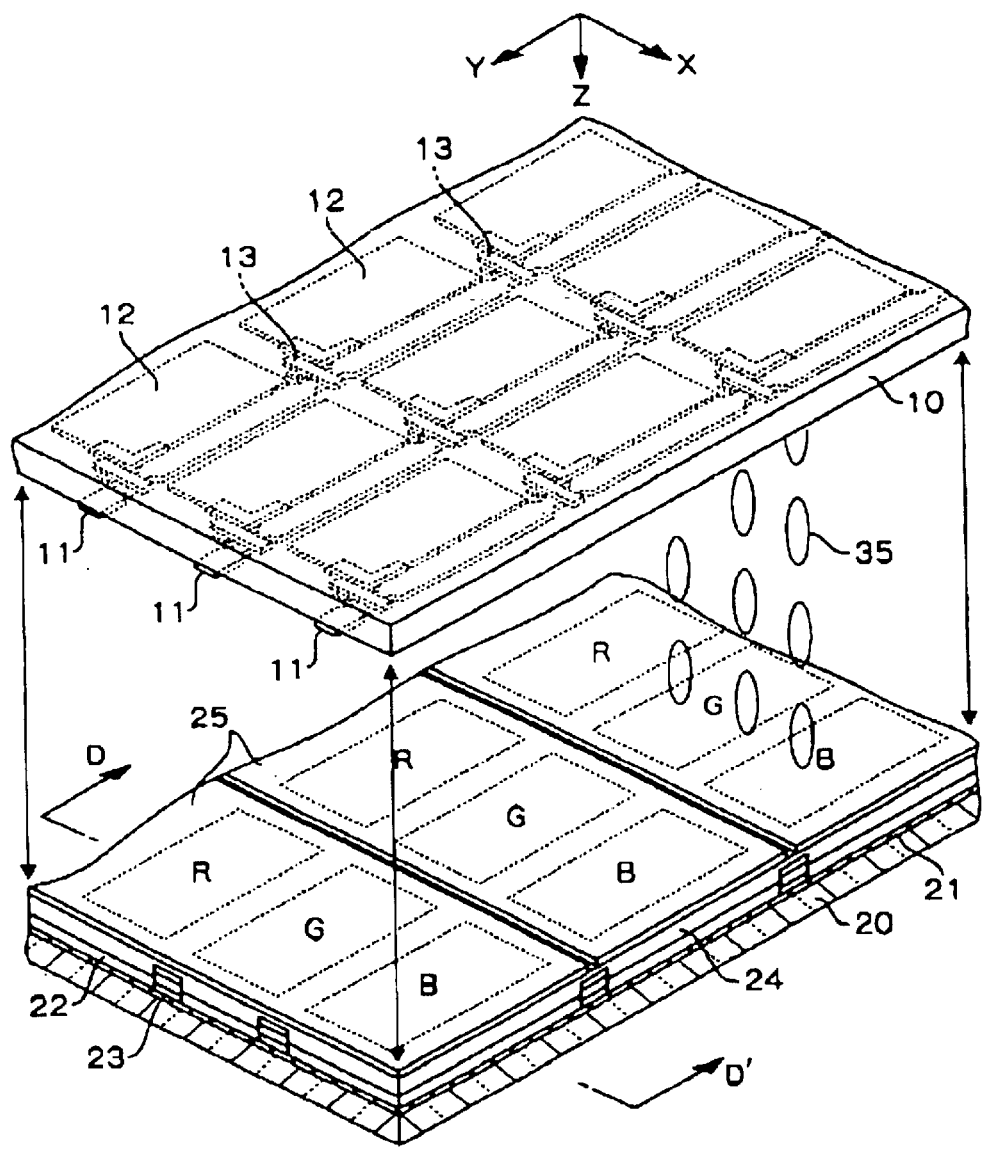
FIG. 4 is a perspective view showing the construction in the display area of the liquid crystal device shown in FIG. 2(*a*).

A description will now be made of the configuration of the area surrounded by the inner periphery of the sealing material 30, i.e., the display area V. FIG. 3 is a sectional view showing a portion of the display area V, taken along line C–C' in FIG. 2(a). FIG. 4 is a perspective view showing several display dots formed in the display area V. A sectional view taken along line D–D' in FIG. 4 corresponds to FIG. 3.

As shown in these drawings, in the display area V, a plurality of pixel electrodes 12 arranged in a matrix, and a plurality of data lines 11 extended in the Y direction in the spaces between the respective pixel electrodes 12 are formed on the inner surface of the element substrate 10, i.e., on the liquid crystal-side surface. Each of the pixel electrodes 12 is a substantially rectangular electrode made of a transparent conductive material, for example, ITO (Indium Tin Oxide) or the like. Each of the pixel electrodes 12 is connected to the data line 11 adjacent to one side of the pixel electrode 12 through a TFD element 13.

As shown in FIG. 3, the surface of the element substrate 10 on which the data lines 11, the pixel electrodes 12 and the TFD elements 13 are formed is coated with an alignment film 56 (not shown in FIG. 4). The alignment film 56 comprises an organic thin film of polyimide or the like, and is subjected to rubbing for defining the orientation of a liquid crystal 35 with no voltage applied.

Figure 5:
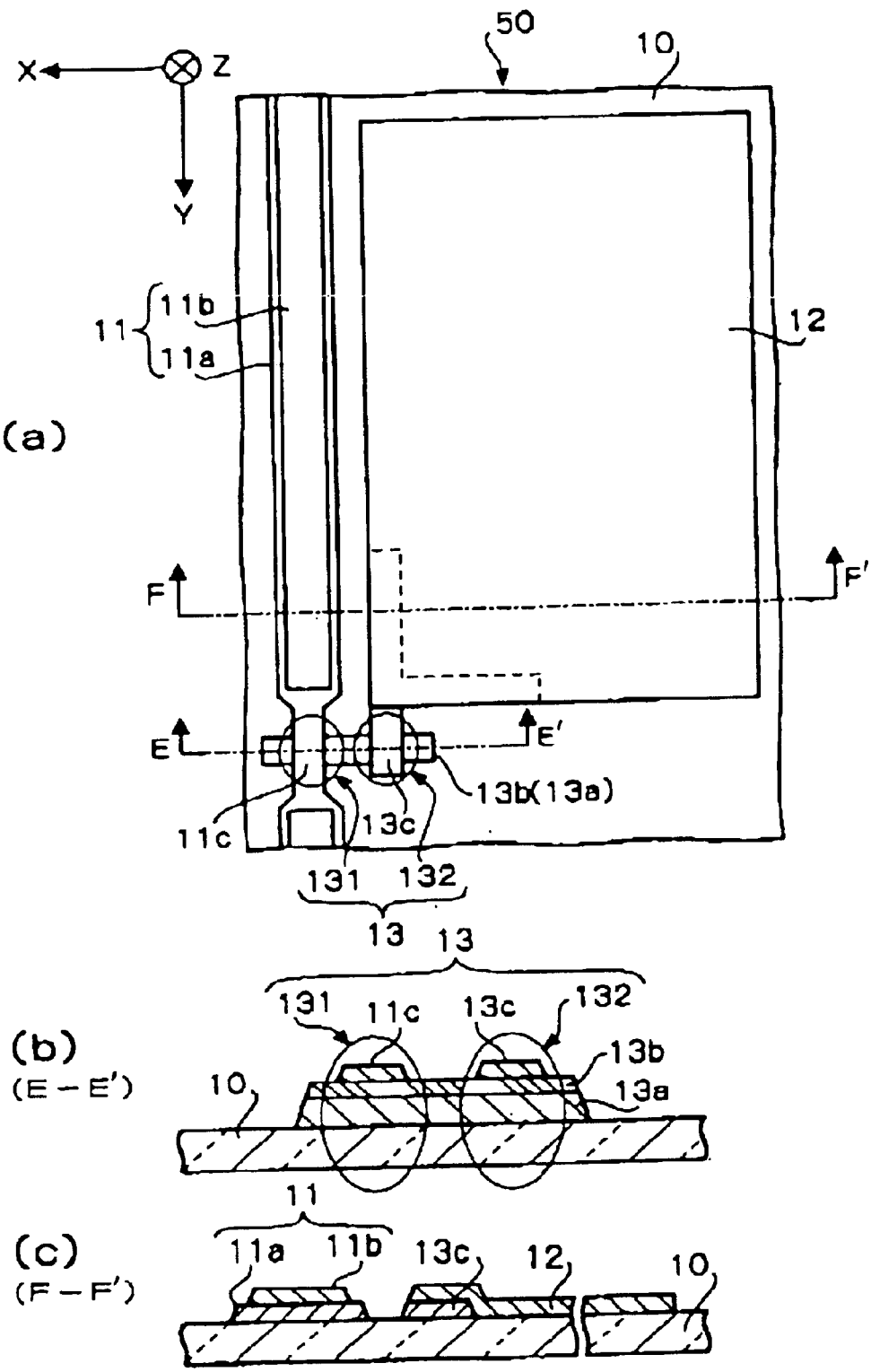
FIG. 5(*a*) is a plan view showing one pixel electrode and one TFD element shown in FIG. 4, FIG. 5(*b*) is a sectional view taken along line E–E' in FIG. 5(a), and FIG. 5(*c*) is a sectional view taken along line F–F' in FIG. 5(*a*).

FIG. 5(*a*) shows one display dot 50 on the element substrate 10, as viewed from the counter substrate side, i.e., the rear side opposite to the observation side. FIG. 5(*b*) is a sectional view taken along line E–E' in FIG. 5(*a*), and FIG. 5(*c*) is a sectional view taken along line F–F' in FIG. 5(*a*). As shown in FIGS. 5(*a*) and 5(*c*), each of the data lines 11 comprises main wiring 11*a*, and auxiliary wiring 11*b* laminated on the main wiring 11*a*. The auxiliary wiring 11*b* is wiring functioning as the data line 11 in place of the main wiring 11*a*, for example, when the main wiring 11*a* is disconnected, the auxiliary wiring 11*b* being formed by using the same layer as the pixel electrodes 12.

On the other hand, as shown in FIGS. 5(*a*) and 5(*b*), each of the TFD elements 13 comprises a first metal film 13*a* extended in the X direction to cross the main wiring 11*a* of the corresponding data line 11, an insulating film 13*b* formed on the surface of the first metal film 13*a* by anodization, and second metal films 11*c* and 13*c* formed with a space therebetween on the surface of the insulating film 13*b*.

The first metal film 13*a* is made of any one of various conductive materials, for example, a tantalum (Ta) single material, tantalum alloys containing tungsten (W) or the like. However, in this embodiment, the first metal film 13*a* is made of tantalum. The second metal film 11*c* is positioned in a portion of the main wiring 11*a* constituting the corresponding data line 11 to cross the first metal film 13*a*, as shown in FIG. 5(*a*). The auxiliary wiring 11*b* is laminated on a portion of the main wiring 11*a* except the portion corresponding to the second metal film 11*c*.

The second metal film 13*c* is connected to each of the pixel electrodes 12. The main wiring 11*a* (including the second metal films 11*c*) of the data lines 11 and the second metal films 13*c* are formed by using the same layer made of any one of various conductive materials such as chromium (Cr), aluminum (Al), and the like. However, in this embodiment, the main wiring 11*a* and the second metal films 13*c* are made of chromium.

Each of the TFD elements 13 comprises a first TFD element 131 and a second TFD element 132. Namely, as shown in FIGS. 5(*a*) and 5(*b*), the first TFD element 131 comprises the second metal film 11*c*, the insulating film 13*b* and the first metal film 13*a* which are laminated in this order from the data line side to form a metal/insulator/metal sandwich structure. As a result, the first TFD elements 131 have diode switching characteristics in positive and negative directions.

On the other hand, the second TFD element 132 comprises the first metal film 13*a*, the insulating film 13*b* and the second metal film 13*c*, which are laminated in this order from the data line side to have the diode switching characteristics opposite to the first TFD element 131.

In this way, each of the TFD elements 13 comprises the two diodes connected in series opposite to each other, thereby symmetrizing the nonlinear current-voltage characteristics in the positive negative directions. However, in order to secure symmetry of the nonlinear characteristics, the insulating films 13*b* of the first TFD elements 131 must be formed in the same thickness as the insulating films 13*b* of the second TFD elements 132, and the area of each of the first TFD elements 131, where the first metal film 13*a* is opposed to the second metal film 11*c*, must be equal to the area of each of the second TFD elements 132, where the first metal film 13*a* is opposed to the second metal film 13*c*.

In this embodiment, in order that the area of the first TFD element 131 is equal to the area of the second TFD element 132, the portion of the main wiring 11*a* constituting each of the data lines 11, which corresponds to the second metal film 11*c*, is narrower than the other portion, as shown in FIG. 5(*a*).

In FIGS. 3 and 4, a reflecting layer 21, a color filter 22, a light shielding layer 23, an overcoat layer 24, the plurality of scanning lines 25 and an alignment film 26 are formed on the counter substrate 20. The reflecting layer 21 comprises a thin film made of a light reflecting metal, for example, aluminum, silver, or the like. In FIG. 3, light R incident from the observation side is reflected by the surface of the reflecting layer 21, and emitted to the observation side to realize a so-called reflective display.

As shown in FIG. 3, the area of the inner surface of the counter substrate 20, which is coated with the reflecting layer 21, has a roughened surface having many micro irregularities formed therein. Therefore, the roughened surface of the counter substrate 20 is reflected in the surface of the reflecting layer 21 comprising a thin film formed to coat the roughened surface of the counter substrate 20 to form micro irregularities. The irregularities function as a scattering structure for scattering light. As a result, light incident from the observation side is properly reflected by the surface of the reflecting layer 21 to avoid specular reflection by the surface of the reflecting layer 21, thereby realizing a wide viewing angle.

The color filter 22 comprises a resin layer formed on the surface of the reflecting layer 21 in correspondence with each of the display dots 50, and is colored in any of R (red), G (green) and B (blue) with a dye or pigment, as shown in FIG. 4. The three display dots 50 having different colors form one pixel for forming a display image.

The light shielding layer 23 is formed in a lattice corresponding to the spaces between the respective pixel electrodes 12 arranged in a matrix on the element substrate 10, and functions to shield the spaces between the respective pixel electrodes 12 from light. In this embodiment, the light shielding layer 23 comprises a lamination of R, G and B three-color layers of the color filter 22, as shown in FIG. 3. The overcoat layer 24 is a layer for removing the irregularities formed by the color filter 22 and the light shielding layer 23, and is made of, for example, an epoxy or acryl resin material.

The scanning lines 25 are stripe electrodes made of a transparent conductive material such as ITO or the like, and formed on the overcoat layer 24. As shown in FIG. 4, the scanning lines 25 are formed to extend in the X direction respectively corresponding to the X-direction columns of the plurality of pixel electrodes 12 formed on the element substrate 10. Therefore, each of the liquid crystal display elements 51 shown in FIG. 1 comprises the pixel electrode 12, the scanning line 25 opposed to the pixel electrode 12, and the liquid crystal 35 sandwiched between both components.

When scanning signals are supplied to the scanning lines 25, and data signals are supplied to the data lines 11 to apply a voltage of a threshold value to each of the TFD elements 13, the TFD elements 13 are turned on. As a result, charges are stored in the liquid crystal display elements 51 connected to the TFD elements 13 to change orientation of the liquid crystal 35. In this way, orientation of the liquid crystal 35 is changed for each of the display dots 50 to perform a desired display. Even when the TFD elements 13 are turned off after charge storage, the charge storage in the liquid crystal display elements 51 is maintained.

In FIG. 3, the surface of the overcoat layer 24 on which the plurality of scanning lines 25 are formed is coated with the alignment film 26. The alignment film 26 is made of the same material as the alignment film 56 of the element substrate 10, and is further subjected to the same rubbing as the alignment film 56.

Figure 6:
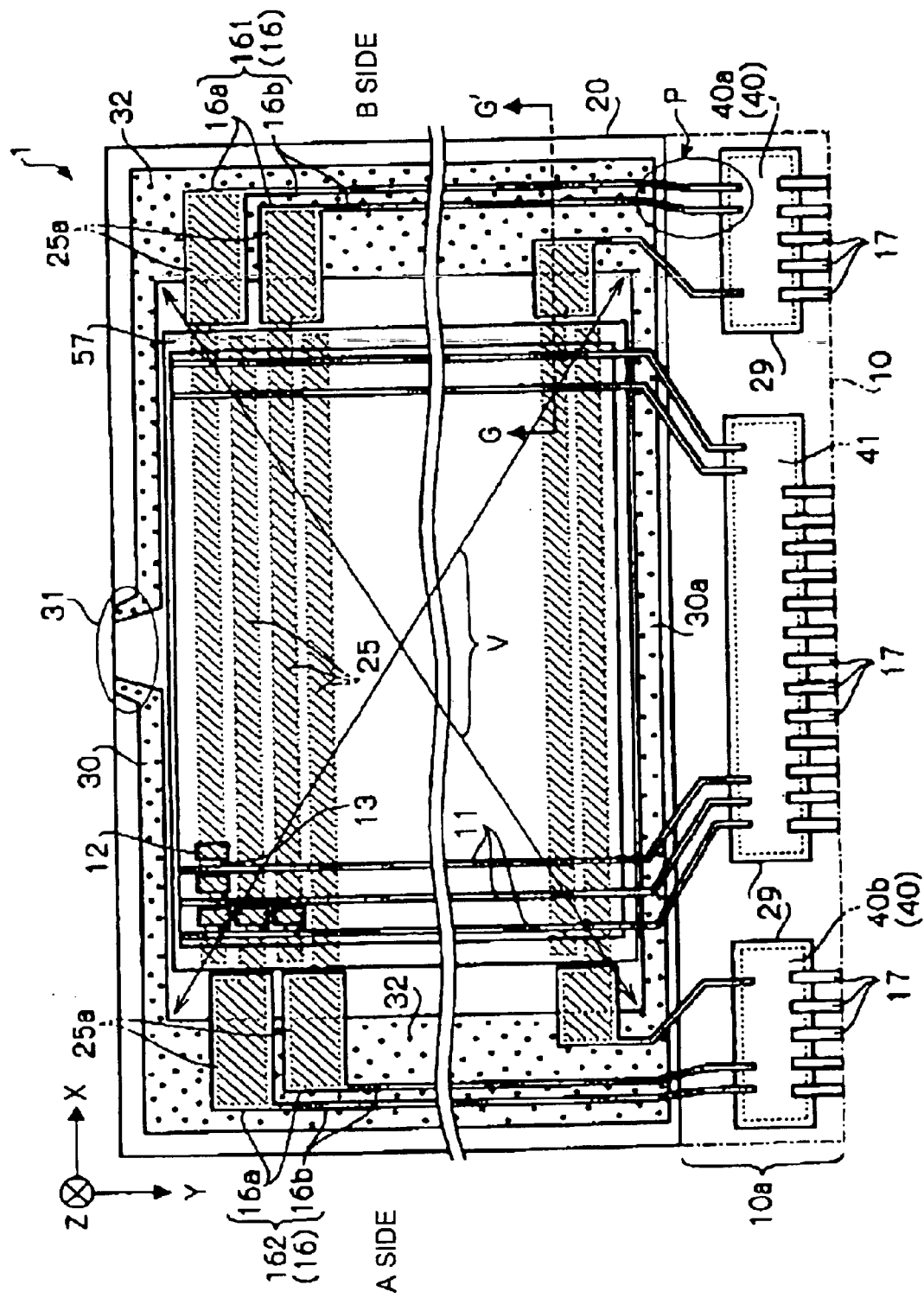
FIG. 6 is a sectional plan view of the liquid crystal device shown in FIG. 2(*a*).

Next, the form of the wiring in the liquid crystal device of this embodiment will be described with reference to FIG. 6. FIG. 6 shows a planar structure of the liquid crystal device 1, as viewed from the observation side, i.e., the element substrate side. FIG. 6 also shows the data lines 11 and the like formed on the element substrate 10 with the substrate material of the element substrate 10 being removed. In FIG. 6, the direction from the front side to the rear side of the sheet corresponds to the positive direction of the Z direction shown in FIGS. 2(a) and 2(b). Therefore, in FIG. 6, the element substrate 10 is positioned on the front side of the drawing, while the other elements are positioned on the rear side of the drawing relative to the element substrate 10.

In FIG. 6, the data lines 11 extend in the Y direction in the display area V, and cross one side 30a of the sealing material 30 to the projecting region 10a. The projecting ends of the data lines 11, which project to the projecting region 10a, are connected to output terminals of the X driver IC 41 through the conductive particles contained in ACF 29. In this construction, the data signals produced by the X driver IC 41 are output to each of the data lines 11.

Figure 7:
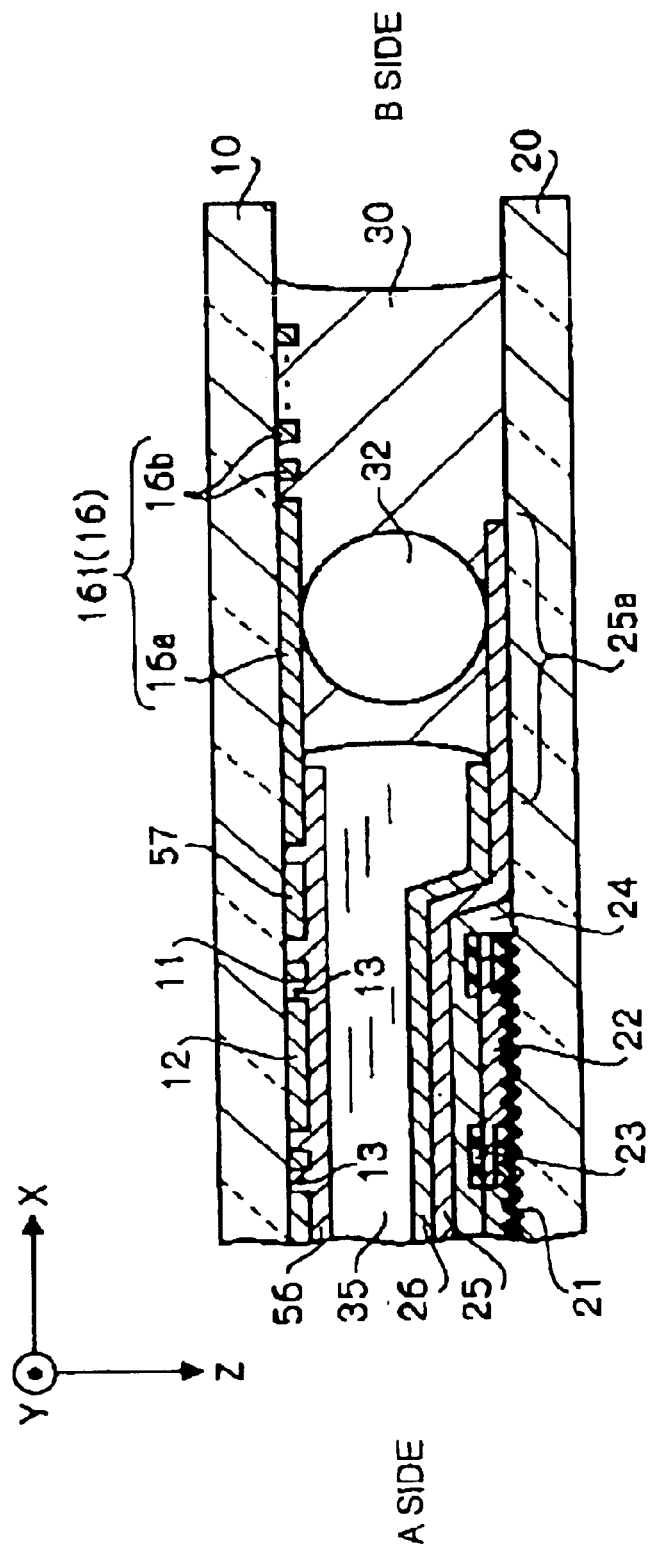
FIG. 7 is a sectional view taken along line G–G' in FIG. 6.

In FIG. 6, the plurality of scanning lines 25 (shadowed in the drawing) extended in the X direction on the counter substrate 20 are alternately led to the A side and the B side so that the led ends are overlapped with the sealing material 30. FIG. 7 is a sectional view taken along line G–G' in FIG. 6, i.e., a sectional view corresponding to the odd-numbered scanning lines 25. As shown in FIG. 7, the color filter 22 and the overcoat layer 24 are not formed near the region of the counter substrate 20, which is coated with the sealing material 30. On the other hand, the odd-numbered scanning lines 25 are extended from the upper surface of the overcoat layer 24 to the upper surface of the counter substrate 20 in the X direction toward the B side-edge of the sealing material 30, the ends of the odd-numbered scanning lines being coated with the sealing material 30. Namely, the ends of the scanning lines 25 are interposed between the counter substrate 20 and the sealing material 30.

In FIG. 6, the ends (referred to as "conductive portions 25a" hereinafter) of the scanning lines 25, which are coated with the sealing material 30, is wider than the portions present in the display area V. This is also true for the even-numbered scanning lines 25. As shown in FIG. 6, the even-numbered scanning lines 25 extend in the X direction toward the A-side edge of the sealing material 30 so that the conductive portions 25a positioned at the ends are overlapped with the A-side edge of the sealing material 30. Furthermore, a peripheral light shielding layer 57 having a frame-like shape along the edge of the display area V is formed on the liquid crystal-side surface of the element substrate 10 to be located near the inner periphery of the sealing material 30. The peripheral light shielding layer 57 is a layer for shielding the vicinity of the edge of the display area V from light.

In FIGS. 6 and 7, a plurality of lead wirings 16 are formed on the liquid crystal-side surface of the element substrate 10 along the two edges of the element substrate 10, which extend in the Y direction, so as to extend to the other side crossing the two edges. The lead wirings 16 are wirings for connecting the output terminals of the Y driver ICs 40 to the scanning lines 25. More specifically, the lead wirings 16 include lead wirings 161 formed along the B-side edge of the element substrate 10, and lead wirings 162 formed along the A-side edge of the element substrate 10. Each of the lead wirings 16 comprises a conductive portion 16a and an extended portion 16b extended along the edge of the element substrate 10.

The conductive portions 16a of the lead wirings 16 are formed opposite to the conductive portions 25a of the scanning lines 25. As shown in FIG. 7, the conductive portions 25a of the odd-numbered scanning lines 25 formed on the counter substrate 20 are conductively connected to the conductive portions 16a of the lead wirings 161 formed on the element substrate 10 through the conductive particles 32 dispersed in the sealing material 30. This is true for the even-numbered scanning lines 25. Namely, the conductive portions 25a of the even-numbered scanning lines 25 are conductively connected to the conductive portions 16a of the lead wirings 162 formed on the element substrate 10 through the conductive particles 32 positioned on the A-side edge of the sealing material 30.

As shown in FIG. 6, ends of the extended portions 16b of the lead wirings 16 are connected to the conductive portions 16a, and pass through the regions of the element substrate 10, which are coated with the sealing material 30, i.e., which are overlapped with the sealing material 30, to reach the projecting region 10a. More specifically, the extended portions 16b of the lead wirings 161 are coated with the B-side edge of the sealing material 30 on the element substrate 10 and extended in substantially the same direction as the B-side edge to the B-side portion of the projecting region 10a, i.e., the portion where the first Y driver IC 40a is to be mounted. Furthermore, the ends of the extended portions 16b, which are extended to the projecting region 10a, are connected to output terminals of the first Y driver IC 40a.

On the other hand, the extended portions 16b of the lead wirings 162 are coated with the A-side edge of the sealing material 30 on the element substrate 10 and extended in substantially the same direction as the A-side edge so that the ends of the extended portions 16b, which are extended to the A-side portion of the projecting region 10a, are connected to output terminals of the second Y driver IC 40b. In this embodiment, in the extended portions 16b of the lead wirings 16, the portions coated with the sealing material 30 are extended in substantially the same direction as the edges of the sealing material 30.

In other words, the sealing material 30 is formed so that the sides thereof extending in substantially the same direction as the portions of the lead wirings 16 partially coat the lead wirings 16. Namely, in this embodiment, the sealing material 30 functions as a coating layer for coating the wirings 16.

In order to secure this function, the two sides of the sealing material 30, which extend in the Y direction, i.e., the two sides which coat the lead wirings 16, have a larger width than the two sides extending in the X direction. Namely, the two sides extending in the X direction may have a width sufficient for bonding the element substrate 10 and the counter substrate 20 together, while the two sides extending in the Y direction have a width selected so that both substrates can be bonded together and the lead wirings 16 can be coated.

The scanning signals output from the first Y driver IC 40a are supplied to the conductive portions 25a of the odd-numbered scanning lines 25 formed on the counter substrate 20, through the extended portions 16b and the conductive portions 16a of the lead wirings 161 formed on the element substrate 10 and the conductive particles 32 disposed on the B-side edge of the sealing material 30. Similarly, the scanning signals output from the second Y driver IC 41b are supplied to the conductive portions 25a of the even-numbered scanning lines 25 through the lead wirings 612 and the conductive particles 32 disposed at the A-side edge of the sealing material 30.

In this way, in this embodiment, the lead wirings 16 have portions coated with the sealing material 30, and thus the occurrence of corrosion due to adhesion of moisture or the like to the portions can be avoided. Furthermore, in these portions, neither moisture nor conductive impurities adhere to the plurality of lead wirings 16 to avoid the occurrence of a short circuit between the wirings, thereby permitting a reduction in the interval of the lead wirings 16. As a result, the space where the lead wirings 16 are to be formed can be narrowed.

Next, the layer structure of the lead wirings 16 is described. In this embodiment, the lead wirings 16 are formed by using the same layer as the elements positioned in the display area V, such as the TFD elements 13 and the pixel electrodes 12. However, the portions of the lead wirings 16, which are positioned in the projecting region 10a, i.e., the portions outside the sealing material 30, have a layer structure different from that of the portions coated with the sealing material 30, i.e., the portions overlapped with the sealing material 30. A description will be made in further detail below.

Figure 8:
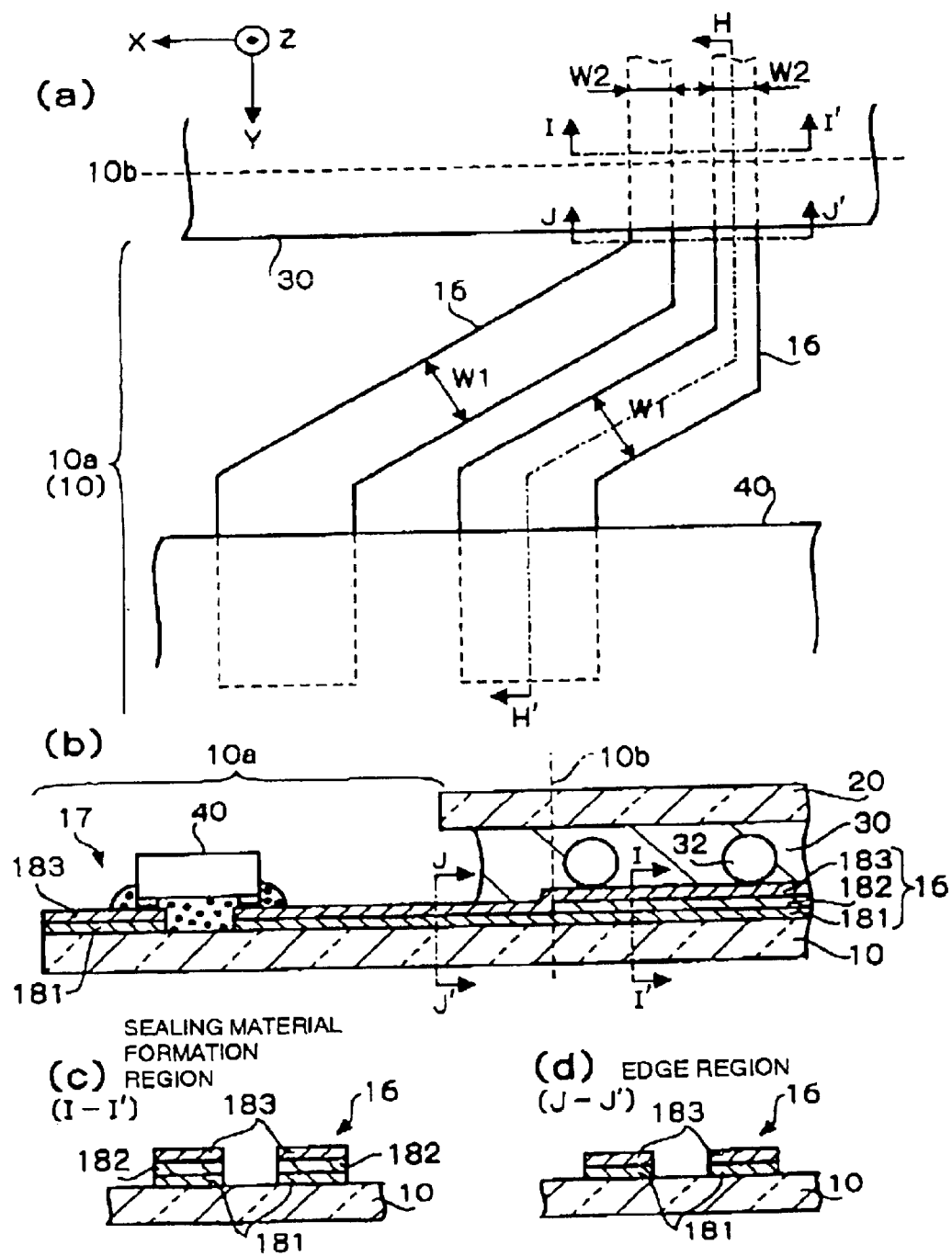
FIG. 8(*a*) is an enlarged plan view showing the portion shown by arrow P in FIG. 6, FIG. 8(*b*) is a sectional view taken along line H–H' in FIG. 8(*a*), and FIG. 8(*c*) is a sectional view taken along line J–J' in FIG. 8(*a*).

FIG. 8(a) is an enlarged view showing the portion shown by arrow P in FIG. 6, i.e., the portions of the lead wirings 16, which extend to the projecting region 10a. FIG. 8(b) is a sectional view taken along line H–H' line in FIG. 8(a). FIG. 8(c) is a sectional view taken along line I–I' line in FIGS. 8(a) and 8(b). FIG. 8(d) a sectional view taken along line J–J' line in FIGS. 8(a) and 8(b).

As shown in the drawings, each of the lead wirings 16 comprises a first wiring layer 181, a second wiring layer 182 and a third wiring layer 183. The first wiring layer 181 is formed by using the same layer as the first metal films 13a (refer to FIG. 5(b)) of the TFD elements 13, the second wiring layer 182 is formed by using the same layer as the main wiring 11a of the data lines 11 and the second metal films 13c (refer to FIG. 5(b)) of the TFD elements 13, and the third wiring layer 183 is formed by using the same layer as the pixel electrodes 12 (refer to FIG. 5(b)). Namely, in this embodiment, the first wiring layer 181 is made of tantalum, the second wiring layer 182 is made of chromium, and the third wiring layer 183 is made of ITO. Since chromium has higher ionization tendency than the tantalum and ITO, the second wiring layer 182 is more easily corroded than the first wiring layer 181 and the third wiring layer 183.

The first wiring layer 181 and the third wiring layer 183 are formed in correspondence with the total length of the lead wirings 16 ranging from the conductive portions 16a shown in FIG. 6 to the ends positioned in the projecting region 10a. On the other hand, the second wiring layer 182 is formed only in the regions of the element substrate 10, which are opposed to the sealing material 30, i.e., the regions of the element substrate 10, which are overlapped with the sealing material 30.

More specifically, the second wiring layer 182 is formed only in the region opposite to the projecting region 10a with respect to a boundary (referred to as a "wiring boundary" hereinafter) 10b positioned at a predetermined length from the outer edge of the sealing material 30 in the inward direction, not formed in the projecting region 10a. Therefore, the portions of the lead wirings 16, which are positioned on the conductive portion-side of the wiring boundary 10b, i.e., which are overlapped with the sealing material 30, have a structure in which the first wiring layer 181, the second wiring layer 182 and the third wiring layer 183 are laminated in this order, as shown in FIGS. 8(b) and 8(c). On the other hand, the portions of the lead wiring 16, which are positioned on the projecting region-side of the wiring boundary 10b, have a structure in which only the two layers including the first wiring layer 181 and the third wiring layer 183 are laminated, as shown in FIGS. 8(b) and 8(d).

In FIG. 8(a), the portions of the lead wirings 16, which are formed in the projecting region 10a, extend at a predetermined angle with the Y direction. Therefore, these portions can secure a wider pitch than the portions extended in the Y direction, i.e., the portions coated with the sealing material 30. In this embodiment, the width W1 of the portions of the lead wirings 16, which are formed in the projecting region 10a, is larger than the width W2 of the portions coated with the sealing material 10.

In FIG. 8(b), the external connecting terminals 17 formed at the end of the element substrate 10 have the same layer structure as the portions of the lead wirings 16, which are positioned on the projecting region-side of the wiring boundary 10b. Namely, each of the external connecting terminals 17 comprises a lamination of the first wiring layer 181 made of tantalum, and the third wiring layer 183 made of ITO.

As described above, in this embodiment, the second wiring layer 182 which is one of a plurality of wiring layers constituting the lead wirings 16 is formed in the regions overlapped with the sealing material 30, while the first wiring layer 181 which is another wiring layer is formed over the total length of the lead wirings 16, thereby causing the advantage that corrosion of the lead wirings 16 can be effectively suppressed. Namely, the second wiring layer 182 made of chromium has a lower resistance value, but has higher ionization tendency than the first wiring layer made of tantalum and the third wiring layer made of ITO, and low corrosion resistance to the air. Therefore, the second wiring layer 182 has the property of being easily corroded.

Therefore, when the second wiring layer 182 is formed in the portions of the lead wirings 16, which are not coated with the sealing material 30, and in the external connecting terminals 17, there is the problem of easily corroding the second wiring layer 182 due to adhesion of moisture or the like in the air. However, in this embodiment, the second wiring layer 182 having high ionization tendency is formed only in the regions coated with the sealing material 30, and thus adhesion of moisture or the like to the second wiring layer 182 can be avoided to suppress corrosion of the second wiring layer 182.

On the other hand, tantalum of the first wiring layer 181 and ITO of the third wiring layer 183 have a higher resistance value than chromium of the second wiring layer 182. Therefore, when the lead wirings 16 each comprising only the first wiring layer 181 and the second wiring layer 182 are formed over the entire length thereof, wiring resistance is increased to possibly adversely affect the display characteristics of the liquid crystal device. However, in this embodiment, the second wiring layer 182 having a lower resistance value is formed in each of the portions of the lead wirings 16, which are coated with the sealing material 30, thereby causing the advantage that an increase in the wiring resistance can be suppressed.

Furthermore, in this embodiment, the portions of the lead wirings 16, which are formed in the projecting region 10a, are wider than the portions coated with the sealing material 30. In other words, the portions each comprising the first wiring layer 181 and the third wiring layer 183 are wider than the portions each comprising the second wiring layer 182. Therefore, it is possible to avoid a problem in which the wiring resistance of the portions formed in the projecting region 10a is significantly increased even when each of the portions comprises the first wiring layer 181 and the third wiring layer 183 having a relatively high resistance value.

As described above, in this embodiment, the lead wirings 16 have the portions coated with the sealing material 30, i.e., the coated portions, thereby permitting the prevention of adhesion of moisture and conductive impurities to the lead wirings 16. As a result, it is possible to suppress corrosion of the lead wirings 16 due to adhesion of moisture, or the like. In the portions of the lead wirings 16, which are coated with the sealing material 30, it is possible to avoid the problem in which moisture and conductive impurities adhere over the plurality of lead wirings 16 to cause a short-circuit between the wirings. It is thus possible to narrow the space between the lead wirings 16, as compared with a conventional structure in which the lead wirings 16 are mostly exposed to the air. As a result, the space for forming the lead wirings 16 can be narrowed to achieve miniaturization of the liquid crystal device. In this embodiment, various problems due to exposure of the lead wirings 16 to the air can be securely prevented.

As a means for preventing exposure of the lead wirings 16 to the air, for example, an insulating layer made of a resin material or the like may be formed to coat the entire length of the lead wirings 16 on the element substrate 10. However, in this case, the step of forming the insulating layer is necessary, thereby increasing the manufacturing cost. However, in this embodiment, the lead wirings 16 are coated with the sealing material 30, and thus the above-described independent step of forming the insulating layer is not required, thereby obtaining the same effect as described above without causing an increase in manufacturing cost.

(Method of Manufacturing Electrooptic Device According to Embodiment)

Figure 9:
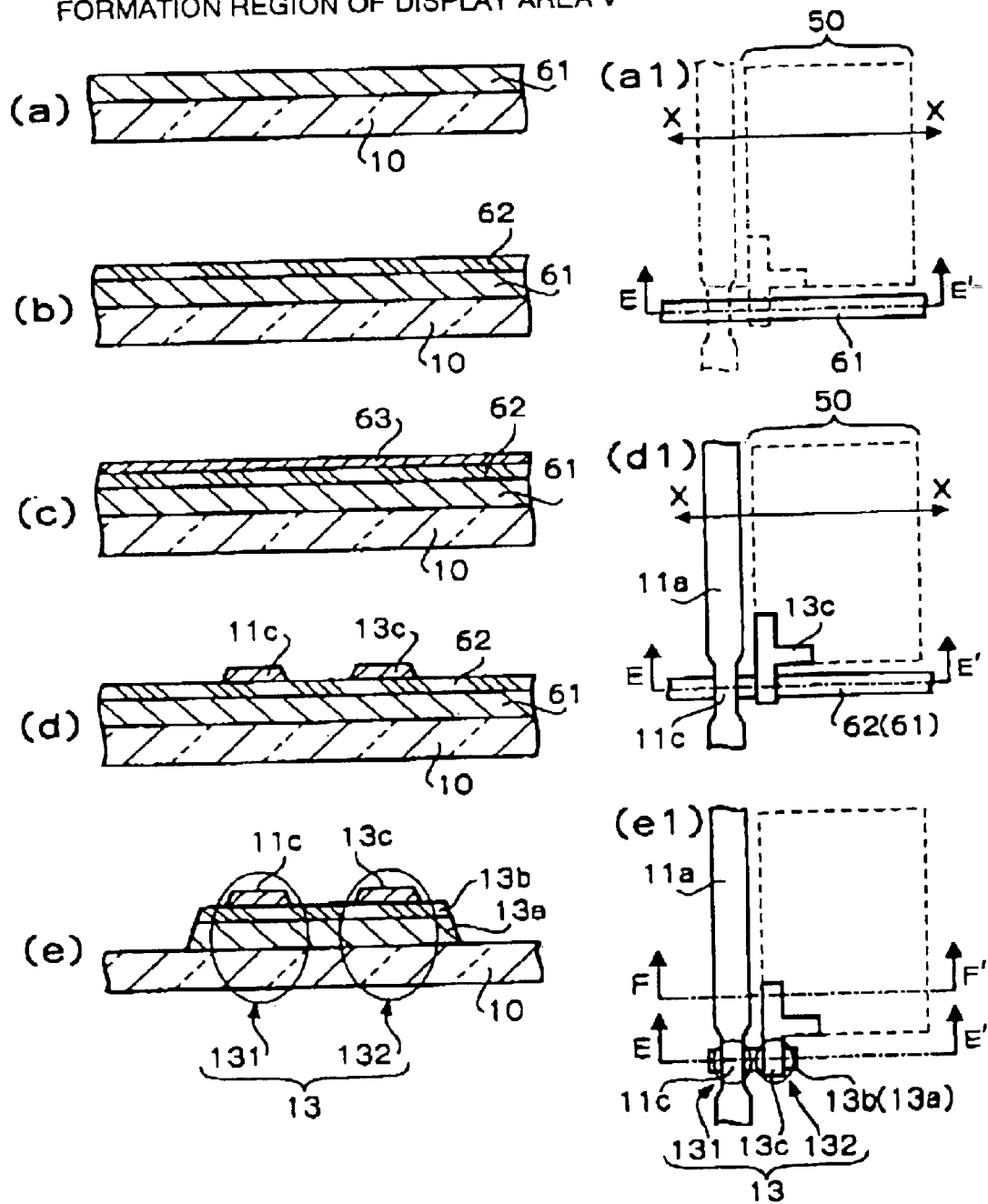
FIG. 9 is a drawing showing the steps of a method of producing a TFD element in a method of manufacturing an electrooptic device according to an embodiment of the present invention.
Figure 10:
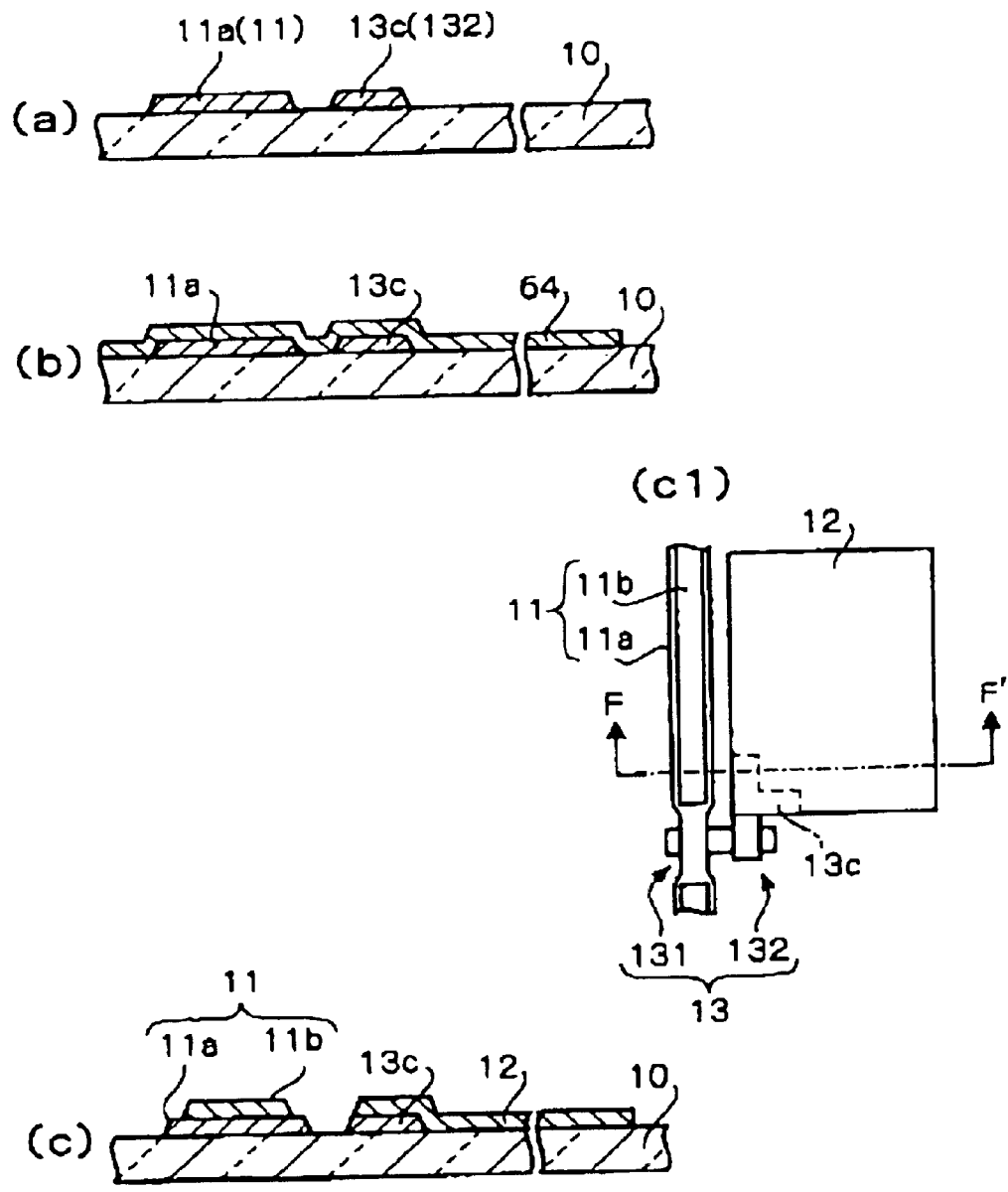
FIG. 10 is a drawing showing the steps related to the steps shown in FIG. 9.
Figure 11:
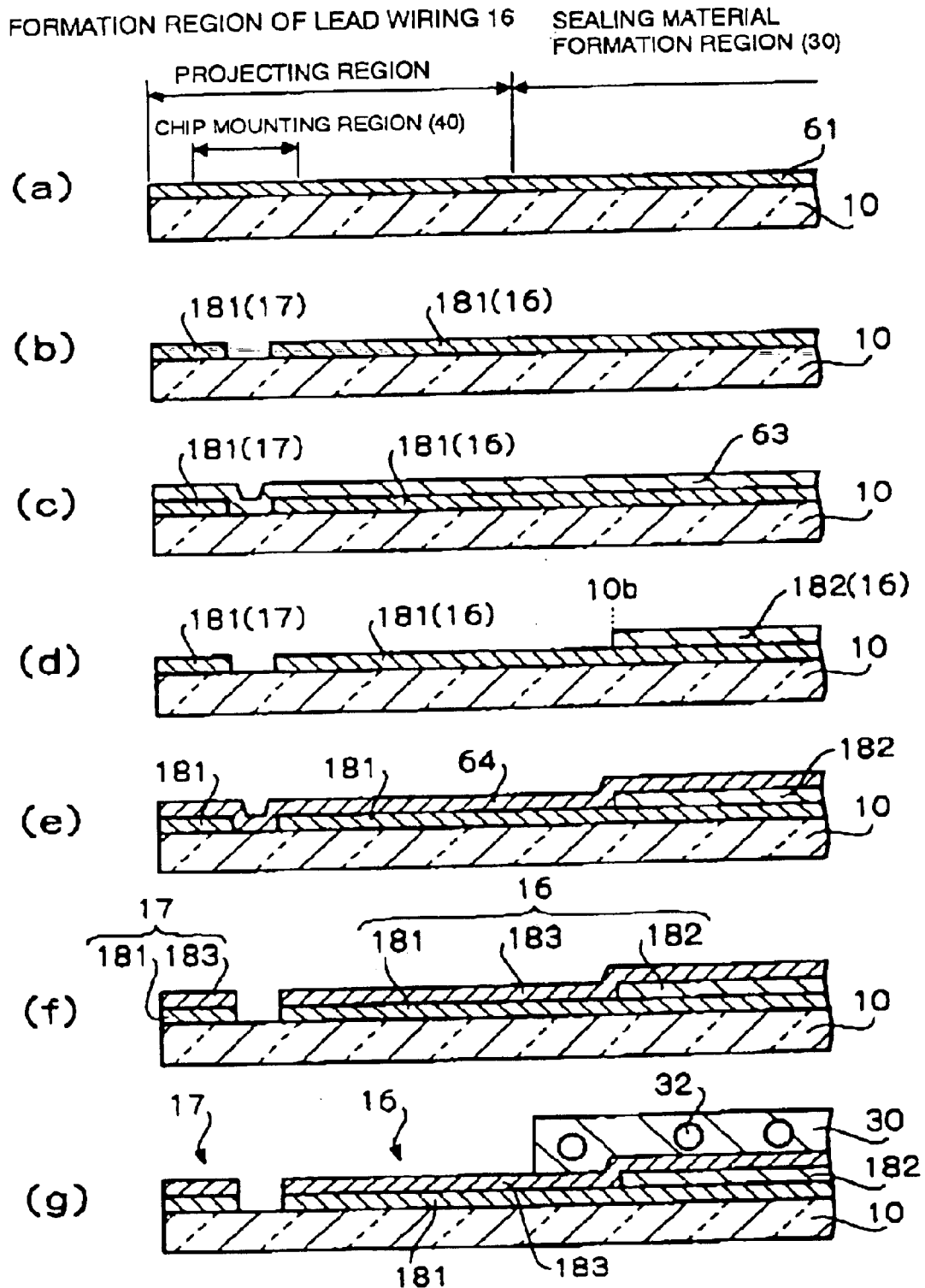
FIG. 11 is a drawing showing the steps of a method of producing a lead wiring in a method of manufacturing an electrooptic device according to an embodiment of the present invention.

A method of manufacturing an electrooptic device will be described. First, a description will be made of a method of producing each of the elements such as the data lines 11, the TFD elements 13, and the like provided on the element substrate 10. FIGS. 9 and 10 show a method of manufacturing one display dot 50 on the element substrate 10 in the order of the steps. FIG. 11 shows a method of producing the lead wirings 16 on the element substrate 10 in the order of the steps.

As described above, in this embodiment, the lead wirings 16 are formed by using the same layer as that for forming the TFD elements 13 and the pixel electrodes 12. Therefore, both the method of producing the display dot 50 and the method of producing the lead wiring 16 will be described in parallel. Also, in the region where the lead wirings 16 shown in FIG. 6 are to be formed, the positional relationship between the projecting region 10a, the region where the sealing material 30 is to be formed, and the region where the Y driver ICs 40 are to be mounted is as shown in FIG. 11(a).

As shown in FIGS. 9(a) and 11(a), a metal film 61 made of tantalum is formed on the surface of the element substrate 10. The metal film can be deposited by using, for example, a sputtering process or an electron beam deposition process. Although a suitable value is selected as the thickness of the metal film 61 according to application of the TFD elements 13, the thickness is generally about 100 nm to 500 nm. Before, the metal film 61 is formed, an insulating film made of tantalum oxide ($Ta_2O_5$) or the like may be formed on the surface of the element substrate 10. By forming the metal film 61 on the insulating film as an underlying film, adhesion between the metal film 61 and the element substrate 10 can be increased, and impurity diffusion from the element substrate 10 to the metal film 61 can be suppressed.

Next, the metal film 61 is patterned by photolithography and etching. Specifically, in the display area V shown in FIG. 6, the metal film 61 is patterned in shapes corresponding to the first metal films 13a of the TFD elements 13 as shown in FIG. 9(e1), and extending along the columns of plurality of display dots 50 in the X direction, as shown in FIG. 9(a1).

On the other hand, in the region where the lead wirings 16 shown in FIG. 6 are to be formed, the first wiring layer 181 constituting the lead wirings 16, and the first wiring layer 181 constituting the external connecting terminals 17 are formed by the same patterning process as described above, as shown in FIG. 11(b). As described above, the first wiring layer 181 constituting the lead wirings 16 is formed over the entire length of the lead wirings 16 from the conductive portions 16a shown in FIG. 6 to the ends positioned in the projecting region 10a.

Next, the surface of the metal film 61 formed in the display area V as shown in FIG. 9(a) is oxidized by anodization to form an oxide film 62 made of tantalum oxide on the surface of the metal film 61, as shown in FIG. 9(b). Specifically, the element substrate 10 is immersed in a predetermined electrolyte, and a predetermined voltage is applied between the metal film 61 in the display area V and the electrolyte to oxidize the surface of the metal film 61. Although a suitable value is selected as the thickness of the oxide film 62 according to the characteristics of the TFD elements 13, the thickness is, for example, about 10 to 35 nm. As the electrolyte used for anodization, for example, a citric acid aqueous solution of 0.01 to 0.1% by weight can be used. Then, in order to remove pinholes and stabilize the film quality, the oxide film 62 formed by anodization is heat-treated. The first wiring layer 181 for the lead wirings 16 shown in FIG. 11(b) is not anodized. Therefore, no oxide film is formed on the surface of the first wiring layer 181 (refer to FIG. 11(c)).

Next, as shown in FIGS. 9(c) and 11(c), a metal film 63 is formed to coat the entire surface of the element substrate 10. The metal film 63 is formed to a thickness of about 50 nm to 300 nm by, for example, the sputtering process. The metal film 63 is a thin film for forming the main wiring 11a of the data lines 11 shown in FIG. 10(c1), the second metal films 13c of the TFD elements 13 shown in FIG. 9(e1) and the second wiring layer 182 of the lead wirings 16 shown in FIG. 11(f). Therefore, in this embodiment, the metal film 63 is made of chromium.

Then, the metal film 63 shown in FIGS. 9(c) and 11(c) is patterned by photolithography and etching. As a result, in the display area V, the main wirings 11a having narrow portions corresponding to the second metal films 11c are formed as shown in FIGS. 9(d) and 9(d1), and the second metal films 13c of the second TFD elements 13 are formed as shown in FIG. 9(e1).

On the other hand, in the region where the lead wirings 16 are to be formed, the metal film 63 shown in FIG. 11(c) is patterned to form the second wiring layer 182 as shown in FIG. 11(d). Namely, the second wiring layer 182 having a shape corresponding to each of the portions extended from the wiring boundary 10b to the conductive portion sides of the lead wirings 16 is formed. In other words, in the metal film 63 formed on the surface of the first wiring layer 181 formed in the previous step, the portions on the projecting region side (including the portion where the external connecting terminals 17 are to be formed) of the wiring boundary 10b are removed.

Next, in FIG. 9(d), the metal film 61 and the oxide film 62 are patterned by photolithography and etching to form the first metal film 13a and the insulating film 13b constituting the TFD element 13 of each of the display dots 50, as shown in FIGS. 9(e) and 9(e1). Namely, the metal film 61 coated with the oxide film 62 is partially removed in correspondence with the spaces between the columns of the display dots 50 in the X direction to pattern the first metal films 13a and the insulating films 13b as islands crossing both the second metal films 11c and 13c. In this step, the first TFD element 131 and the second TFD element 132 are formed for each of the display dots 50. FIG. 10(a) is a sectional view taken along line F-F' in FIG. 9(e1), and showing a cross sectional shape of the main wiring Ha of each of the data line 11, and the second metal film 13c of each of the second TFD elements 132.

In patterning the metal film 61 and the oxide film 62 as shown in FIG. 9(d), the first wiring layers 181 and the second wiring layers 182 of the lead wirings 16 shown in FIG. 11(d) are not processed.

Although, in this embodiment, the metal film 61 and the oxide film 62 shown in FIG. 9(d) are patterned after the metal film 63 is patterned as shown in FIG. 9(c), conversely the metal film 63 may be formed and patterned after the metal film 61 and the oxide film 62 are patterned.

Next, as shown in FIGS. 10(b) and 11(e), a transparent conductive film 64 made of ITO is formed to coat the entire surface. This film can be deposited by, for example, sputtering or the like. Then, the transparent conductive film 64 is patterned by, for example, photolithography and etching. As a result, in the display area V, as shown in FIGS. 10(c) and 10(c1), the pixel electrodes 12 connected to the second metal films 13c of the second TFD elements 132, and the auxiliary wirings 11b constituting the data lines 11 together with the main wirings 11a are formed.

On the other hand, outside the display area V, a third wiring layer 183 is formed to coat the first wiring layers 181 and the second wiring layers 182 in correspondence with the entire lengths of the lead wirings 16, and coat the first wiring layers 181 of the external connecting terminals 17, as shown in FIG. 11(f).

Then, the alignment film 56 is formed to coat the display area V of the element substrate 10, as shown in FIG. 3, and then subjected to rubbing in a predetermined direction. Next, as shown in FIG. 11(g), the sealing material 30 containing the conductive particles 32 dispersed therein is coated by a technique, for example, screen printing or the like. In this step, the sealing material 30 is coated so that the lead wirings 16 are coated with the sides of the sealing material 30, which extend in substantially the same direction as the extension direction of the lead wirings 16.

Figure 12:
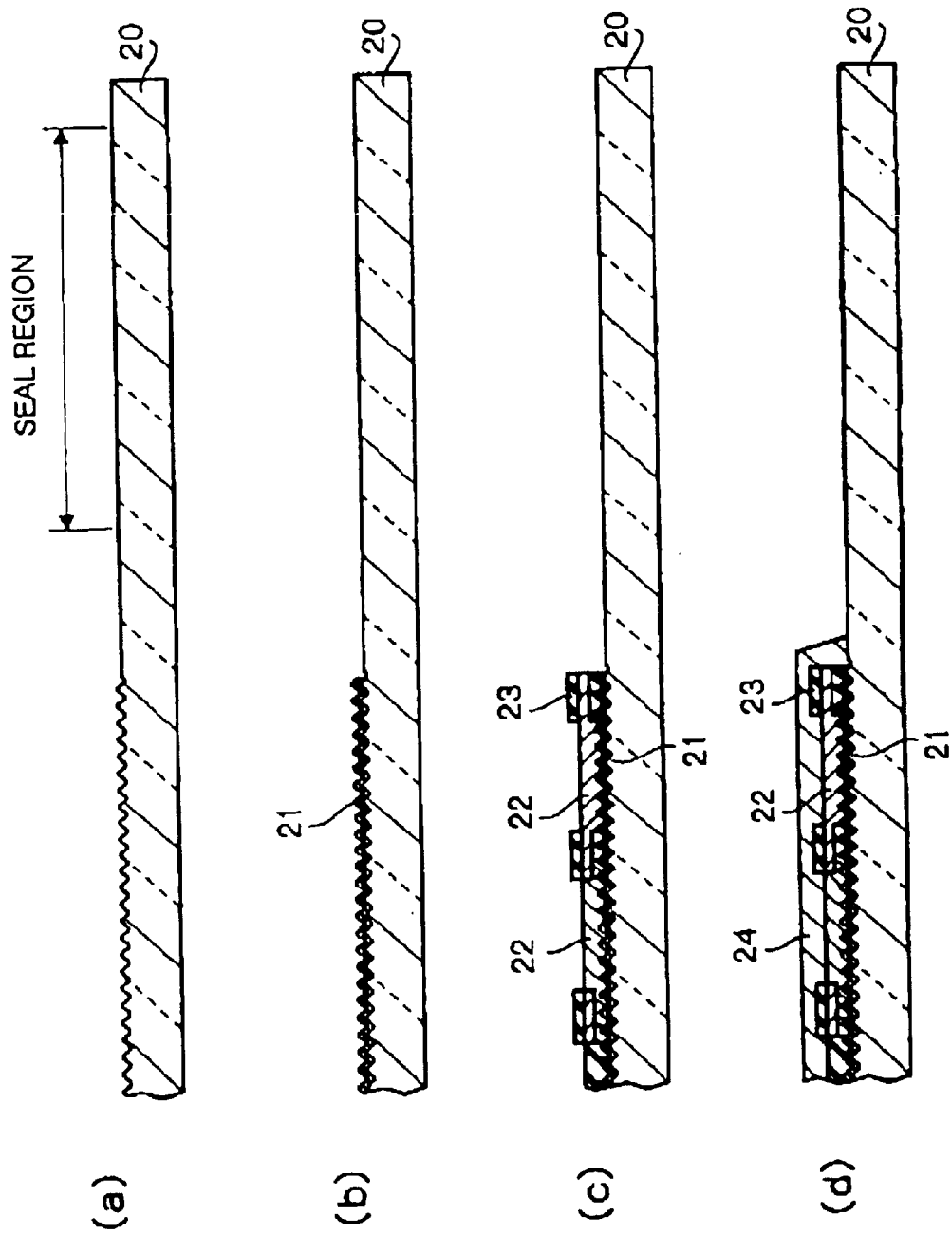
FIG. 12 is a drawing showing the steps of a method of producing elements on a counter substrate in a method of manufacturing an electrooptic device according to an embodiment of the present invention.
Figure 13:
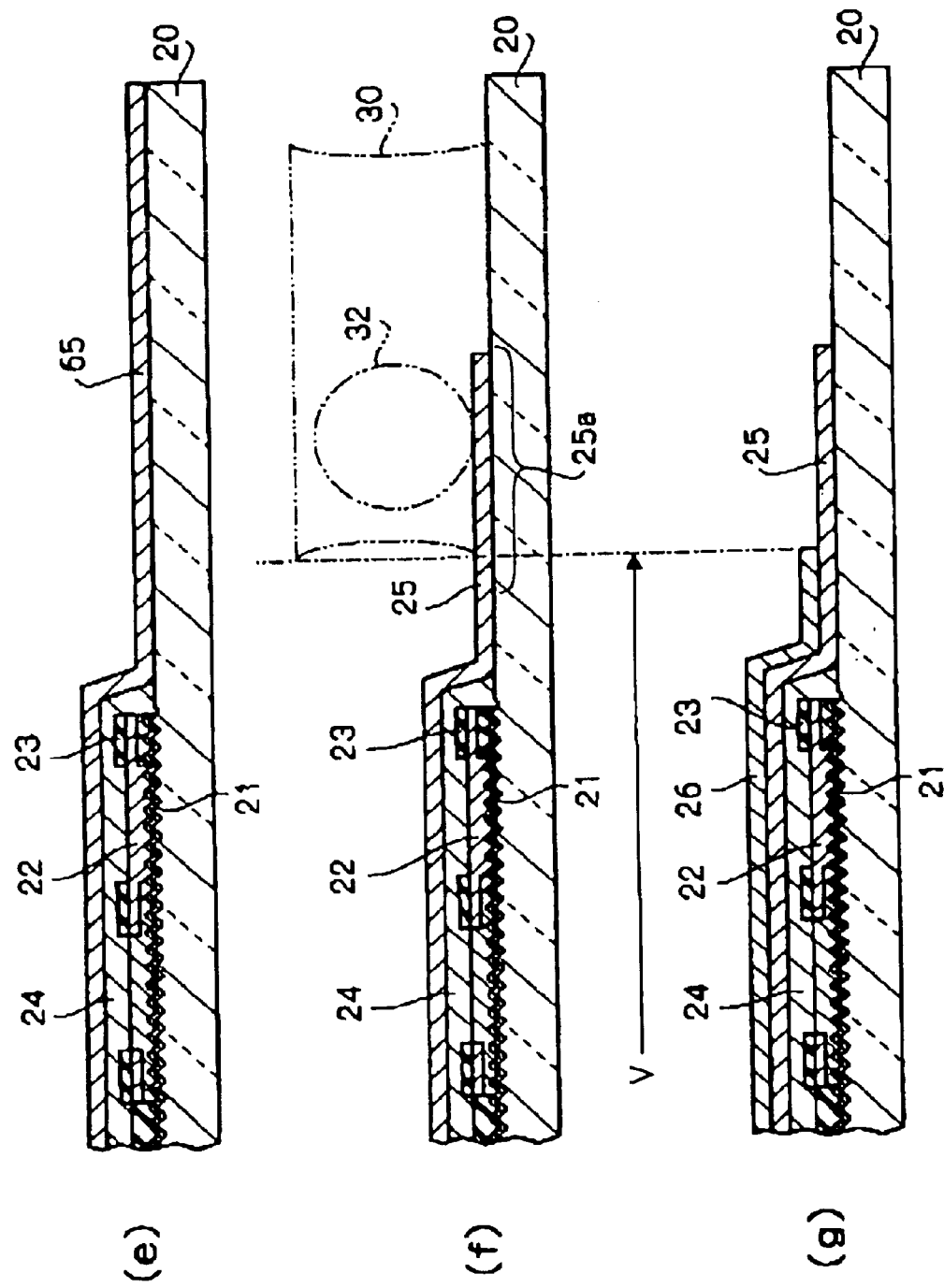
FIG. 13 is a drawing showing steps after the steps shown in FIG. 12.

The method of producing each of the elements on the element substrate 10 shown in FIG. 3 is as described above. On the other hand, each of the elements provided on the counter substrate 20 is formed through, for example, the steps shown in FIGS. 12 and 13. These drawings are sectional views showing a vicinity of the region of the counter substrate 20 shown in FIG. 6, which should be coated with the sealing material 30. The region which should be coated with the sealing material 30 is referred to as the "seal region" shown in FIG. 12(a).

In FIG. 12(a), the surface of the region of the counter substrate 20, in which the reflecting layer 21 is to be formed, is roughened. More specifically, many micro portions of the surface of the counter substrate 20 are selectively removed by a predetermined thickness by, for example, etching. This process forms a roughened surface having recesses corresponding to the removed portions, and protrusions corresponding to the remaining portions on the counter substrate 20.

However, the method of roughening the surface of the counter substrate 20 is not limited to this. For example, an epoxy or acryl resin layer is formed to coat the counter substrate 20, and many micro portions of the surface of the resin layer are selectively removed. Then, the resin layer is softened by heating to round the edges formed by etching to form the roughened surface having smooth irregularities.

Next, a metal thin film having light reflectivity is formed to coat the entire surface of the counter substrate 20 shown in FIG. 12(a) by sputtering or the like. This thin film is made of, for example, a single metal such as aluminum, silver, or the like, or an alloy containing the single metal as a main component. Then, the thin film is patterned by photolithography and etching to form the reflecting layer 21, as shown in FIG. 12(b).

Next, as shown in FIG. 12(c), the color filter 22 and the light shielding layer 23 are formed on the surface of the reflecting layer 21. Namely, a resin film colored in any one of R (red), G (green) and B (blue), for example, R color, with a dye or pigment is formed on the surface of the reflecting layer 21, and then the resin film is removed to leave the portions where the R color filter 22 is to be formed, and the lattice region where the light shielding layer 23 is to be formed, i.e., the regions corresponding to the spaces between the respective display dots 50. Thereafter, this step is repeated for the other two colors, i.e., G and B colors to form the color filter 22 corresponding to any one of the R, G and B colors, and the light shielding layer 23 comprising a lamination of the three color layers.

Then, as shown in FIG. 12(d), an epoxy or acryl resin material is coated to coat the color filter 22 and the light shielding layer 23, and then burned to form the overcoat layer 24. Next, as shown in FIG. 13(e), a transparent conductive film 65 made of ITO is formed to coat the counter substrate 20 on which the elements are formed. This film is deposited by, for example, sputtering.

The transparent conductive film 65 is then patterned by photolithography and etching to form the plurality of scanning lines 25, as shown in FIG. 13(f). The scanning lines 25 are formed so that each of the scanning lines reaches the regions where the A-side and B-side edges of the sealing material 30 are to be formed, the conductive portion 25a being formed at the ends of each of the scanning lines 25.

Then, as shown in FIG. 13(g), the alignment film 26 is formed to coat the display area V, and subjected to rubbing.

Next, the element substrate 10 and the counter substrate 20 obtained through the above-described steps are bonded together so that the electrode formation surfaces thereof are opposed to each other with the sealing material 30 provided therebetween. In this step, the relative position between both substrates 10 and 20 is adjusted so that the conductive portions 25a of the respective scanning lines 25 are opposed to the conductive portions 16a of the lead wirings 16 with the sealing material 30 provided therebetween.

Then, the liquid crystal is sealed in the region surrounded by both substrates 10 and 20 and the sealing material 30 as shown in FIG. 2 through the opening formed in the sealing material 30, and then the opening is sealed with a sealant 31. Then, a polarization plate and retardation plate are bonded to the outer surface of each of both substrates 10 and 20, and the X driver IC 41 and the Y driver IC 40 are mounted on the projecting region 10a of the element substrate 10 by the COG technique to obtain the above-described liquid crystal device 1.

As described above, in this embodiment, the lead wirings 16 are formed by using a layer common to the TFD elements 13 and the pixel electrodes 12, and thus the manufacturing process can be simplified to achieve a reduction of manufacturing cost, as compared with the case in which the steps of forming the TFD elements 12 and the lead wirings 16 are separately performed.

Also, the sealing material is formed so that portions of the lead wirings 16 are coated with the sides of the sealing material extending in insubstantially the same direction as the extension direction of the portions of the lead wirings 16, and thus exposure of the lead wirings 16 to the air can be prevented without an increase in the number of the manufacturing steps.

Although an embodiment of the present invention is described above, the embodiment is only an example, and various modifications of the embodiment can be made within the scope of the gist of the present invention. Conceivable modified embodiments will be described below.

(Electrooptic Device of Second Embodiment)

Figure 14:
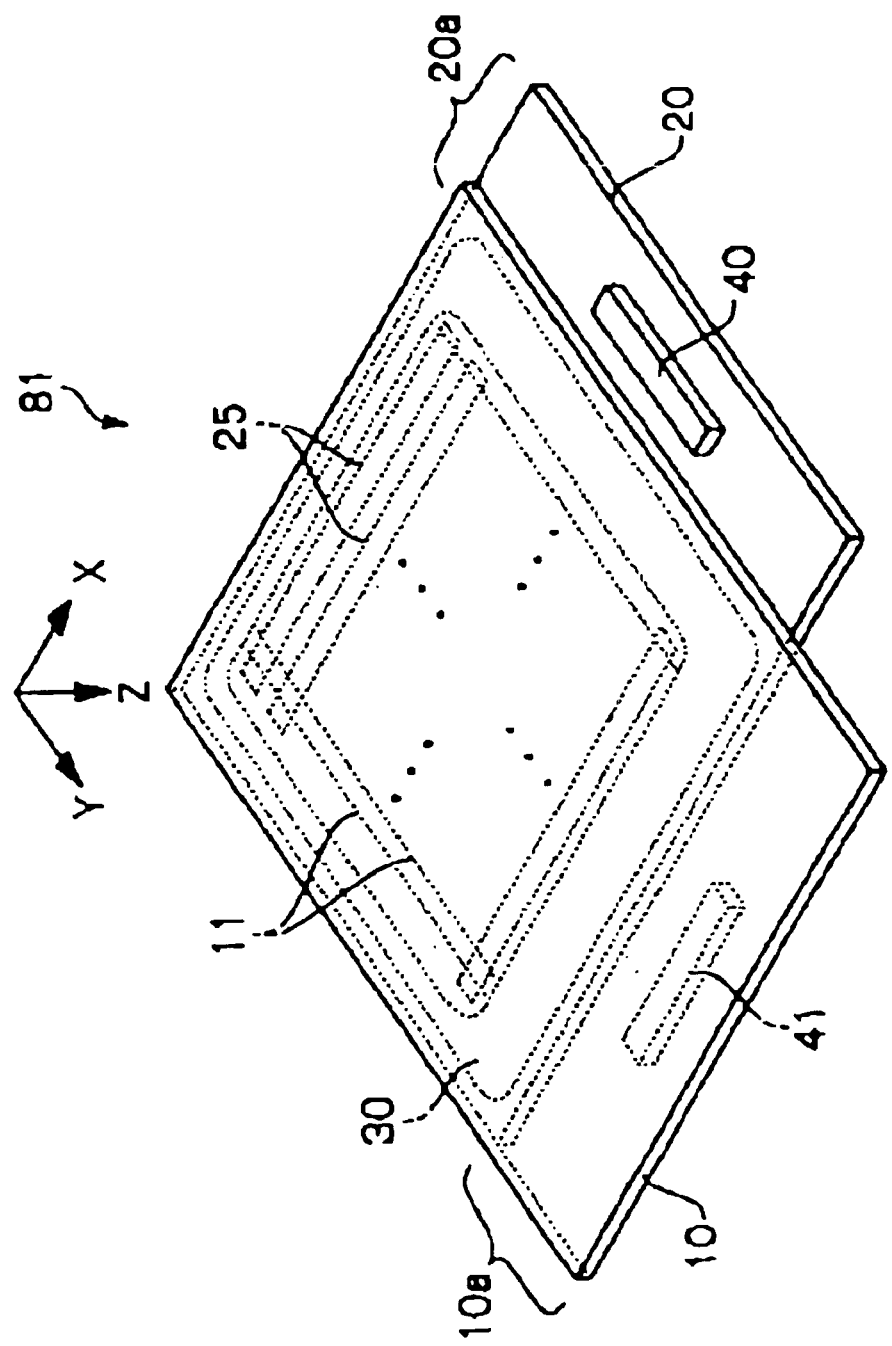
FIG. 14 is a sectional plan view showing another embodiment in which in which the present invention is applied to a liquid crystal as an example of electrooptic devices.

Although the above-described embodiment shown in FIG. 6 has the construction in which the scanning lines 25 on the counter substrate 20 are electrically connected to the lead wirings 16 on the element substrate 10, the construction shown in FIG. 14 can be used in place of the construction of the first embodiment. In FIG. 14, the same components as those shown in FIG. 6 are denoted by the same reference numerals.

As shown in FIG. 14, in a liquid crystal device 81 of this embodiment, the element substrate 10 and the counter substrate 20 comprise projecting regions 10a and 20a, respectively, each of which is projected from the peripheral edge of the sealing material 30 in one direction. The plurality of data lines 11 formed on the element substrate 10 extend to the projecting region 10a in the Y direction to be connected to output terminals of the X driver IC 41 mounted on the projecting region 10a. In fact, each of the pixel electrodes 12 is connected to the corresponding data line 11 through the TFD element 13. However, these elements are not shown in FIGS. 14 and 15.

On the other hand, the plurality of scanning lines 25 formed on the counter substrate 20 extend to the projecting region 20a in the X direction to be connected to output terminals of the Y driver IC 40 mounted on the projecting region 20a. In this way, the liquid crystal device 81 of this embodiment is different from the embodiment shown in FIG. 6 in that the scanning lines 25 formed on the counter substrate 20 extend to the projecting region 20a to be connected to the Y driver IC 40 without being electrically connected to wiring on the element substrate 10. Therefore, the conductive particles 32 are not necessarily dispersed in the sealing material 30.

FIG. 15(a) shows the positional relationship between the data lines 11 serving as wiring on the element substrate 10 and the sealing material 30 in the liquid crystal device 81 shown in FIG. 14. In FIG. 15(a), the data lines 11 and the X driver IC 41 are positioned on the rear side of the sheet of the drawing relative to the element substrate 10. The data lines 10 are extended from the display area V to the projecting region 10a in the Y direction, and are bent at a substantially right angle in the region coated with one side 30a of the sealing material 30 near the projecting region 10a to be extended in substantially the same direction as the one side 30a of the sealing material 30, i.e., in the X direction. Furthermore, the data lines 11 are bent at a substantially right angle in the region coated with one side 30a of the sealing material 30 so that the ends reach the region of the projecting region 10a, in which the X driver IC 41 is to be mounted.

On the other hand, FIG. 15(b) shows the positional relationship between the scanning lines 25 serving as wiring on the counter substrate 20 and the sealing material 30 in the liquid crystal device 81. As shown in FIG. 15(b), the positional relationship between the scanning lines 25 and the sealing material 30 is the same as that between the data lines 11 and the sealing material 30. Namely, the scanning lines 25 extended in the X direction in the display area V are bent in the region coated with one side 30b of the sealing material 30 near the projecting region 20a to be extended in substantially the same direction as the one side 30b of the sealing material 30, i.e., in the Y direction. Furthermore, the scanning lines 25 are bent in the region coated with one side 30b of the sealing material 30 so that the ends reach the region of the projecting region 20a, in which the Y driver IC 40 is to be mounted.

Figure 15:
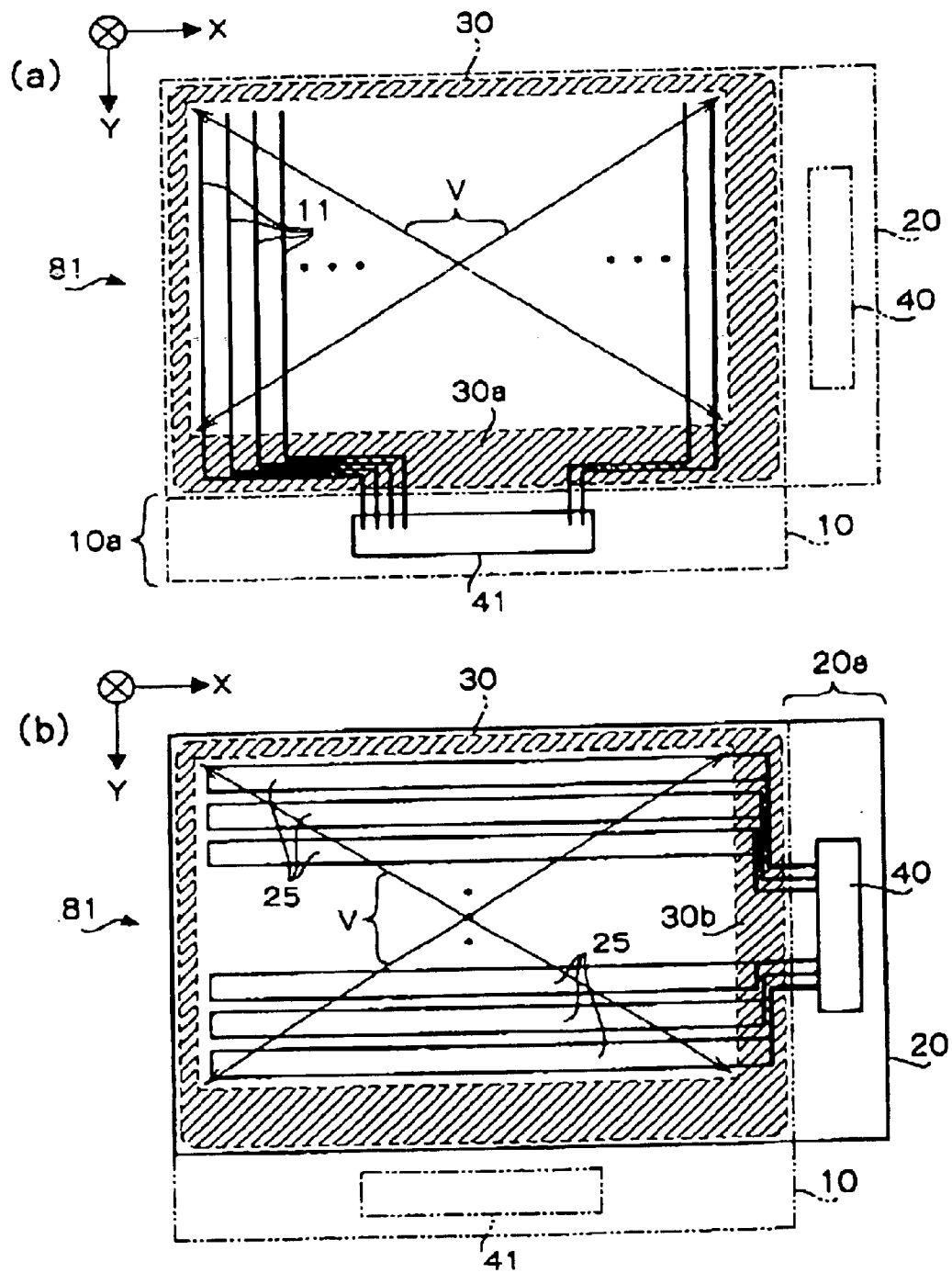
FIG. 15 is a plan view showing the relationship between an electrode and wiring in the liquid crystal device shown in FIG. 14.

In this way, in this embodiment, either the data lines 25 or the scanning lines 25 are coated with one side of the sealing material 30. Namely, either the data lines 25 or the scanning lines 25 are coated and have the portions, i.e., coated portions, extended in substantially the same direction as the one side. In other words, the sealing material 30 is formed so that one side thereof coats the portions of the data lines 11 or the scanning lines 25, which extend in substantially the same direction as the one side. Therefore, as shown in FIGS. 14 and 15, the two sides of the substantially rectangular sealing material 30 near the projecting regions 10a and 20a are wider than the other two sides. In this embodiment, the same effect as the above embodiment shown in FIG. 6 can be obtained.

(Electrooptic Device of Third Embodiment)

In the embodiment shown in FIG. 6, the sides of the sealing material 30 which coat the lead wirings 16 are wider than the other sides. However, the width of the sides coating the lead wirings 16 is not necessarily different from that of the other sides as long as both substrates 10 and 20 can be bonded together, and the portions of the lead wirings 16 extended in substantially the same direction as the sides can be coated even when the wide of the sides coating the lead wirings 16 is the same as the other sides.

(Method of Manufacturing Electrooptic Device of Another Embodiment)

The method of manufacturing a liquid crystal device in the embodiment shown in FIG. 11 comprises forming the sealing material 30 on the element substrate 10 on which the lead wirings 16 are formed. However, alternatively, the sealing material 30 may be formed on the counter substrate 20 so that the element substrate 10 and the counter substrate 20 are bonded together with the sealing material provided 30 therebetween. Namely, it is sufficient to bond together both substrate 10 and 20 with the sealing material 30 provided therebetween so that portions of the lead wirings 16, which extend in substantially the same direction as the sides of the sealing material 30, are coated with the sides.

(Electrooptic Device of Fourth Embodiment)

The embodiment shown in FIG. 6 has the construction in which the element substrate 10 having the TFD elements 13 formed thereon is positioned on the observation side, and the counter substrate 20 having the scanning lines 25 formed thereon is positioned on the rear side. However, conversely, the element substrate 10 may be positioned on the rear side, and the counter substrate 20 may be positioned on the observation side. In this case, the reflecting layer 21 shown in FIG. 3 may be formed on the element substrate 10, not on the counter substrate 20.

Although, in the embodiment shown in FIG. 3, the color filter 22 and the light shielding layer 23 are formed on the substrate 20 positioned on the rear side, these elements may be formed on the element substrate 10 positioned on the observation side. In addition, neither the color filter 22 nor the light shielding layer 23 may be provided to form a construction only for monochrome display. Namely, in the embodiment shown in FIG. 3, the element substrate 10 corresponds to a "first substrate" of the present invention, and the counter substrate 20 corresponds to a "second substrate" of the present invention. However, each of the "first substrate" and the "second substrate" of the present invention may be a substrate which is positioned on either of the observation side and the rear side, and on which any of the elements such as the TFD elements 13, the reflecting layer 21, the color filter 22, etc. may be formed.

Furthermore, in the embodiment shown in FIG. 3, the reflective liquid crystal device performing only a reflective display is described. However, the present invention can also be applied to a transmissive liquid crystal device performing only a so-called transmissive display. In this case, the reflective layer 21 is not provided on a substrate (in FIG. 3, the counter substrate 20) on the rear side so that light incident from the rear side can be transmitted through a liquid crystal and emitted from the observation side.

Furthermore, the present invention can be applied to a so-called transflective liquid crystal device capable of both a reflective display and a transmissive display. In this case, a reflecting layer having an aperture for each display dot 50, or a transflective layer (a so-called half mirror) reflecting part of light reaching the surface and transmitting part of the light may be provided in place of the reflecting layer 21 of the embodiment shown in FIG. 3, and an illumination device may be provided on the back side of the liquid crystal device.

In the embodiment shown in FIG. 6, the active matrix system liquid crystal device using TFD elements as two-terminal switching elements is illustrated. However, of course, the present invention can be applied to a liquid crystal device using three-terminal switching elements such as TFT (Thin Film Transistor) elements, and a passive matrix system liquid crystal device having no switching element. In this way, the present invention can be applied to any liquid crystal device comprising a sealing material and wiring to be coated with the sealing material regardless of the configuration of other components.

(Electronic Apparatuses of Embodiments)

Next, electronic apparatuses using a liquid crystal device of the present invention will be described. FIG. 16(a) shows a case in which the present invention is applied to a mobile personal computer, i.e., a portable personal computer or a notebook-size personal computer, and particularly, the present invention applied as the display section thereof.

The personal computer 71 shown in this figure comprises a main body 712 comprising a keyboard 711, and a display section 713 comprising the liquid crystal device of the present invention. As an electrooptic device used for the personal computer 71, a transflective electrooptic device capable of not only a reflective display but also a transmissive display is preferably used for securing visibility in a dark place.

FIG. 16(b) shows a case in which the electrooptic device of the present invention is used as a display section of a cellular phone. In FIG. 16(b), a cellular phone 72 comprises a plurality of operating buttons 721, an ear piece 722, a mouth piece 723, and a display section 724. The display section 724 can be formed by using the electrooptic device of the present invention. Also, a transflective electrooptic device is preferably used as the display section 724 for securing visibility in a dark place.

Besides the personal computer shown in FIG. 16(a) and the cellular phone shown in FIG. 16(b), conceivable electronic apparatuses to which the electrooptic device of the present invention can be applied include a liquid crystal television, a viewfinder-type video tape recorder, a monitor direct-viewing-type video tape recorder, a car navigation device, a pager, an electronic notebook, an electric calculator, a word processor, a work station, a picture phone, a POS terminal, a digital still camera, and the like. Also, a projector using the electrooptic device of the present invention as a light valve can be considered as an electronic apparatus according to the present invention.

As described above, the electrooptic device of the present invention can solve various problems due to exposure of wiring to the air, and thus an electronic apparatus using the electrooptic device can avoid conduction defects or the like to secure high reliability.

(Electrooptic Device of Fifth Embodiment)

Figure 17:
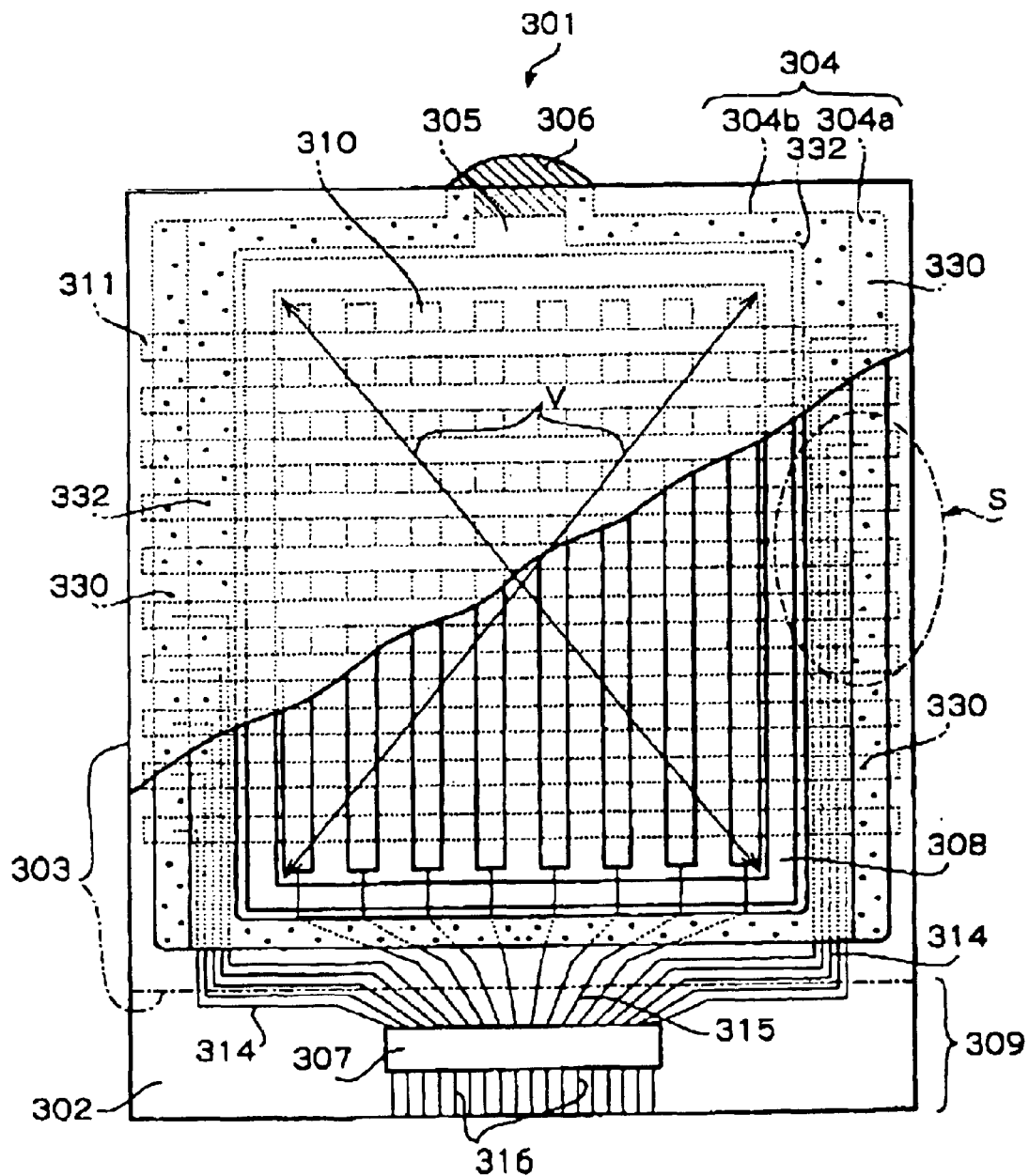
FIG. 17 is a partially broken-out plan view showing a further embodiment in which the present invention is applied to a liquid crystal as an example of electrooptic devices.
Figure 18:
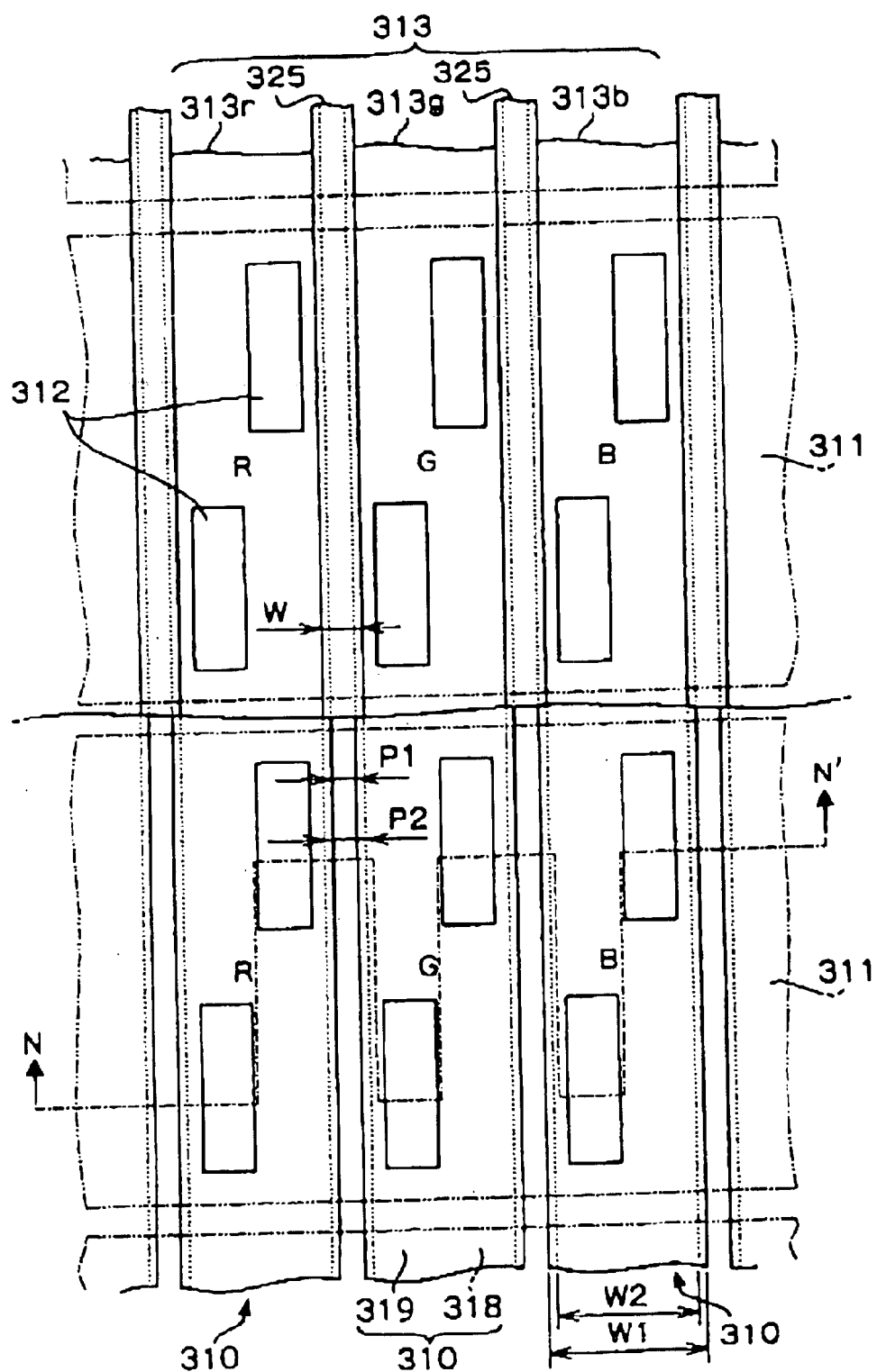
FIG. 18 is an enlarged plan view showing the pixel portion of the liquid crystal device shown in FIG. 17.
Figure 19:
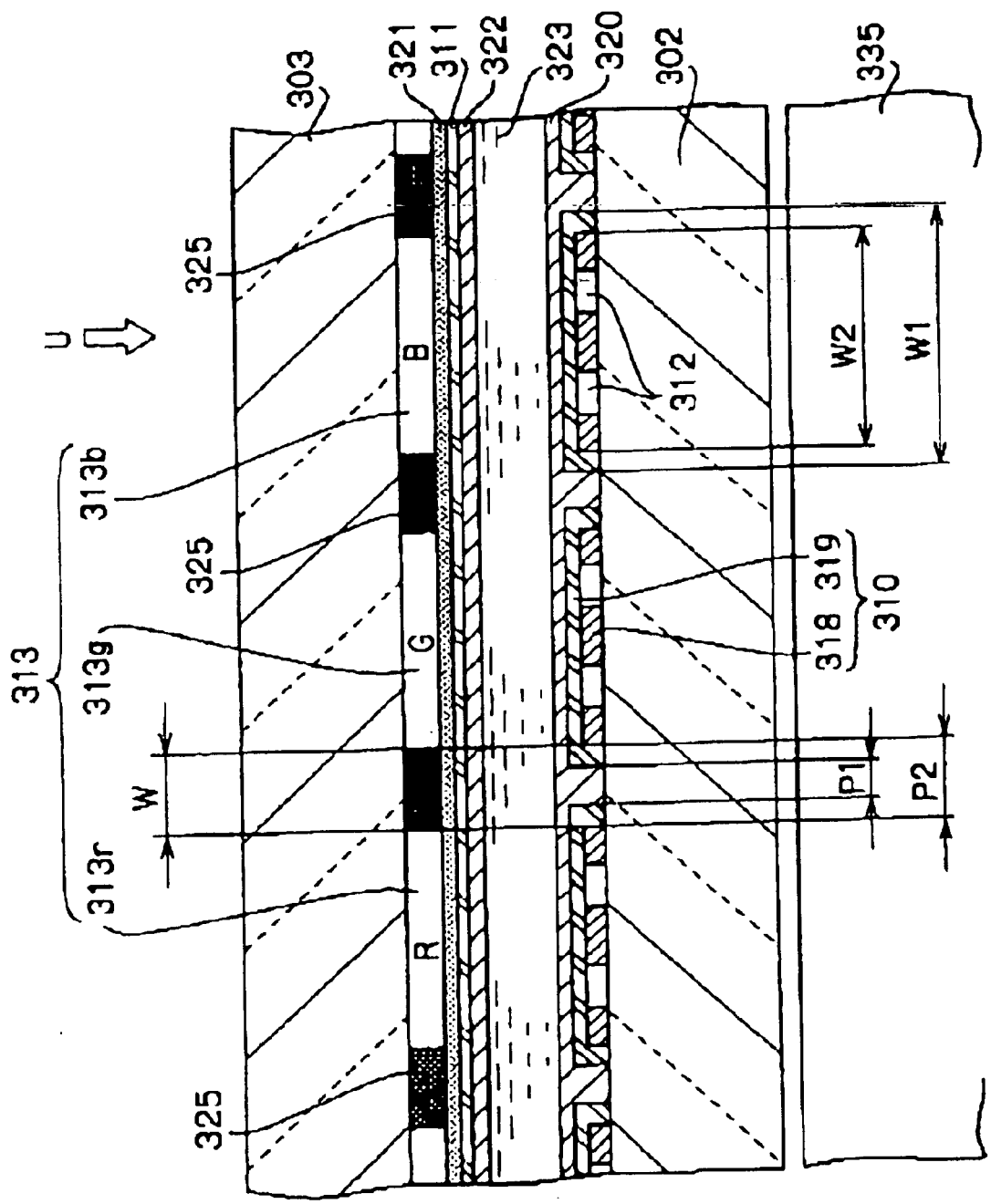
FIG. 19 is a sectional view showing the sectional internal structure of the liquid crystal device taken along line N–N' in FIG. 19.
Figure 20:
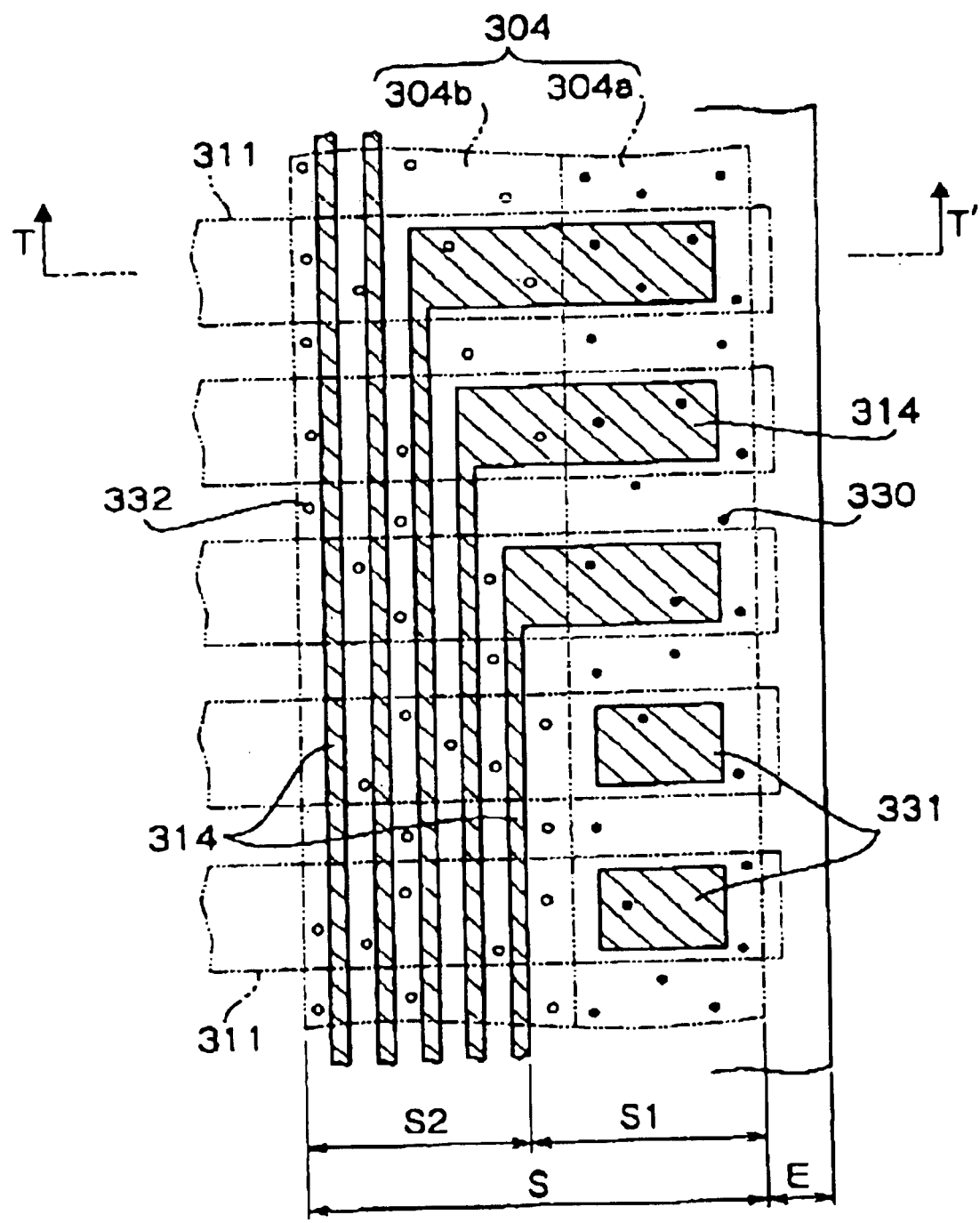
FIG. 20 is an enlarged view showing the portion shown by arrow S in FIG. 17.
Figure 21:
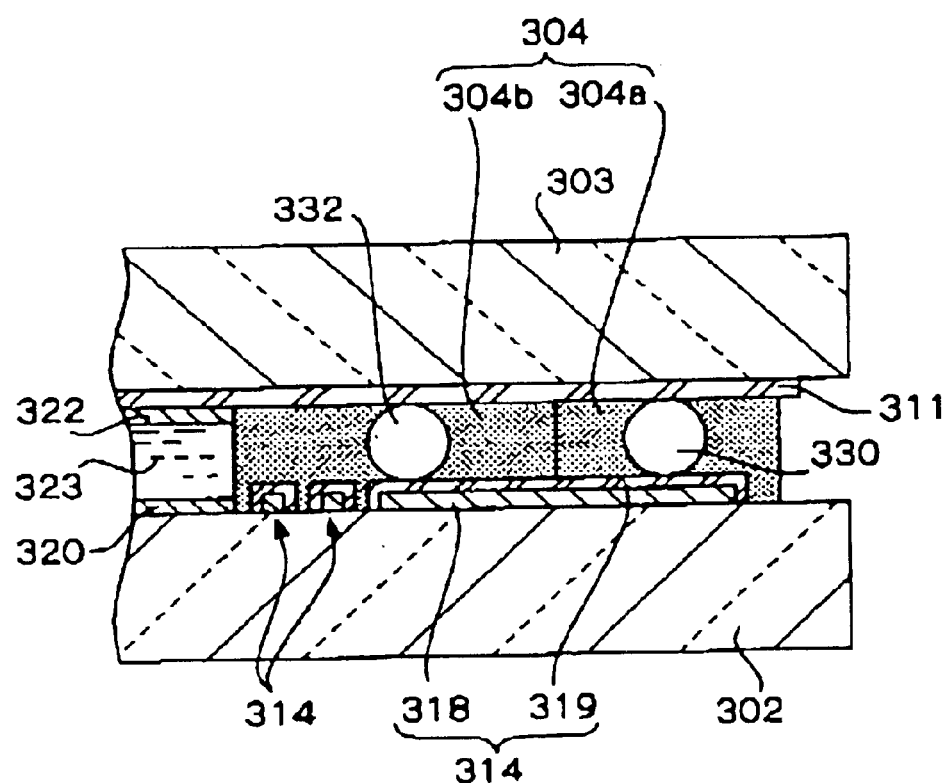
FIG. 21 is an enlarged sectional view showing the seal portion of the liquid crystal device taken along line T–T' in FIG. 20.

A description will be made of an embodiment in which the present invention is applied to a liquid crystal device performing a passive matrix system transflective color display. FIG. 17 shows a liquid crystal device as an example of the electrooptic device of the present invention in accordance with an embodiment of the present invention. FIG. 18 is an enlarged view of a portion of the display area of the liquid crystal device shown in FIG. 17. FIG. 19 shows the sectional structure of the liquid crystal device taken along line N–N' in FIG. 18. FIG. 20 is an enlarged view of the vertical conduction portion shown by arrow S in FIG. 17. FIG. 21 shows the sectional structure of wiring, taken along line T–T' in FIG. 20.

As shown in FIG. 17, a liquid crystal device 301 is formed by bonding together a lower substrate 302 having a rectangular planar shape, and an upper substrate 303 having a rectangular planar shape with a sealing material 304. The sealing material 304 has a liquid crystal inlet 305 formed on one side of each of the substrates 302 and 303, e.g., the upper side in this embodiment, so that a liquid crystal is sealed in the space surrounded by both substrates 302 and 303 and the sealing material 304. Furthermore, the liquid crystal inlet 305 is sealed with a sealant 306.

However, in the sealing material 304 provided in the form of a rectangular ring, the two opposed long sides provided on the right side and the left side of the substrates 302 and 303 comprise a conductive portion 304a containing a conductor such as conductive particles 330, and a nonconductive portion 304b not containing such a conductor, both portions being closely formed without a space therebetween. In this embodiment, the nonconductive portion 304b contains a nonconductive gap material 332.

In the sealing material 304, the two opposed short sides provided on the upper and lower sides of the substrates 302 and 303 are continuously formed from the nonconductive portion 304b. The entire sealing material 304 functions to seal the liquid crystal, and the conductive portion 304a functions to perform conduction between the substrate 302 and the substrate 303.

As shown in FIG. 17, the lower substrate 302 has a longer longitudinal length than the upper substrate 303. The edges of the three sides, i.e., the upper, lower and left sides, of the upper substrate 303, i.e., the end surfaces thereof are coincide with the lower substrate 302. However, the lower substrate 302 is formed so that the peripheral portion projects from the remaining side of the upper substrate 303, i.e., the lower side in FIG. 17, to form a projecting region 309.

Furthermore, a driving semiconductor element 307, i.e., an electronic part, is mounted on the lower-side end of the lower substrate 302, i.e., the portion along the short side thereof, for driving electrodes provided on both the upper substrate 303 and the lower substrate 302. Reference numeral 308 denotes a ring-shaped light shielding layer for shielding the periphery of the display area V from light, the region inside of the inner edge of the light shielding layer 308 serving as the display area V contributing to an actual image display.

As shown in FIGS. 17 and 18, a plurality of segment electrodes 310 are formed in parallel stripes on the lower substrate 302 so as to extend in the longitudinal direction of the figure. On the other hand, a plurality of common electrodes 311 are formed in stripes on the upper substrate 303 so as to extend in the transverse direction of the figure perpendicular to the segment electrodes 310.

In a color filter 313, each of color element layers 313r, 313g and 313b of R, G and B colors is arranged in correspondence with the extension direction of the segment electrodes 310. This arrangement is a so-called longitudinal stripe arrangement, in which each of the R, G and B colors is arranged in the longitudinal direction to form a stripe arrangement at a whole. The three display dots of R, G and B arranged in the lateral direction in FIG. 18 form one pixel on a screen.

Each of the segment electrodes 310 comprises an APC film 318 formed with width W2, and an ITO film 319 formed with width W1, namely comprises a laminated structure with a transparent conductive film. The APC film is made of an alloy containing silver (Ag), palladium (Pa), and copper (Cu) at a predetermined ratio.

In this embodiment, in order that the APC film 318 functions as a tranflective film, the APC film 318 has two light transmitting windows 312, i.e., light transmitting regions, for each of the display dot. The windows 312 are arranged in a staggered shape as the color element layers 313r, 313g or 313b of the color filter 313 is viewed from the longitudinal direction of the plurality of display dots. Herein, the "display dots" represent the planar regions where the segment electrodes 310 and the common electrodes 311 overlap each other.

As shown in FIG. 17, both ends of each of the common electrodes 311 are in contact with conductive portion 304a of the sealing material 304, and extended to the outside of the conductive portion 304a. Of the plurality of common electrodes 311 (FIG. 17 shows only ten common electrodes), the right ends of the five common electrodes 311 in the upper half shown in FIG. 17 are electrically connected to common electrode lead wiring 314 formed on the lower substrate 312, through the conductive particles 330 mixed in the conductive portion 304a.

The lead wiring 314 on the lower substrate 302 is further extended from the conductive portion 304a to the nonconductive portion 304b, bent in the nonconductive portion 304b, extended in the nonconductive portion 304b longitudinally along the right side of the lower substrate 302, and connected to output terminals of the driving semiconductor element 307 mounted on the projecting region 309.

Similarly, the left ends of the common electrodes 311 (FIG. 17 shows only five electrodes) in the lower half shown in FIG. 17 are electrically connected to the lead wiring 314 on the lower substrate 302 through the conductive particles 330 mixed in the conductive portion 304a.

The lead wiring 314 on the lower substrate 302 is further extended from the conductive portion 304a to the nonconductive portion 304b, bent in the nonconductive portion 304b, extended in the nonconductive portion 304b longitudinally along the left side of the lower substrate 302, and connected to output terminals of the driving semiconductor element 307 mounted on the projecting region 309.

Namely, the lead wiring 314 is entirely provided on the substrate 302 to be coated with the sealing material 304. In other words, the sealing material 304 functions as a coating layer for coating the wiring 314.

On the other hand, for the segment electrodes 310, segment electrode lead wiring 315 is extended from the lower ends of the segment electrodes 310 to the nonconductive portion 340b of the sealing material 304, and connected to output terminals of the driving semiconductor element 307. Many lead wirings 314 and 315 cross the nonconductive portion 304b on the lower side of the substrates 302 and 303. However, the nonconductive portion 304b has no conductivity, and thus there is no probability of a short circuit even when the lead wirings 314 and 315 arranged with a narrow pitch cross the nonconductive portion 340b.

In this embodiment, like the segment electrodes 310, each of the lead wirings 314 and 315 comprises a laminated film of an APC film and an ITO film. Furthermore, external connecting terminals 316 are provided to extend from the lower side of the lower substrate 302 to the input terminals of the driving semiconductor element 307, for supplying various signals to the driving semiconductor element 307.

In the sectional structure of the pixel portion of the liquid crystal device, as shown in FIG. 19, the plurality of segment electrodes 310 are formed on the lower substrate 302 comprising a transparent substrate made of glass, plastic, or the like, so as to extend in the vertical direction of the drawing of FIG. 19. The segment electrodes 310 are arranged in parallel with spaces therebetween in the lateral direction of FIG. 19, i.e., formed in stripes as viewed from the direction of arrow U. Each of the segment electrodes 310 has a two-layer structure comprising an APC film 318 formed on the lower substrate 302, and an ITO film 319 laminated on the APC film 318. Also, an alignment film 320 made of polyimide or the like is formed on the segment electrodes 310. The surface of the alignment film 320 is subjected to orientation treatment, for example, rubbing.

In this embodiment, in each of the segment electrodes 310, the width W1 of the ITO film 319 is set to be larger than the width W2 of the APC film 318 so that the ITO film 319 is laminated not only on the upper surface of the APC film 318, but also on the sides of the APC film 318.

On the other hand, the color filter 313 comprising the color element layers 313r, 313g and 313b of R, G and B colors, respectively, is formed on the upper substrate 303 comprising a transparent substrate of glass, plastic, or the like, and an overcoat film 321 is formed on the color filter 313, for planarizing the steps between the respective color element layers and protecting the surface of each of the color element layers. The overcoat film 321 may be made of an acryl or polyimide resin, or an inorganic film such as a silicon oxide film or the like.

Furthermore, the common electrodes 311 each comprising an ITO single layer film are formed in stripes on the overcoat film 321 so as to extend in the lateral direction of the drawing of FIG. 19. Also, an alignment film 322 made of polyimde or the like is formed on the common electrodes 311, and subjected to rubbing. A liquid crystal 323 comprising a STN (Super Twisted Nematic) liquid crystal is sandwiched between the upper substrate 303 and the lower substrate 302. Furthermore, an illumination device 335 is arranged as a back light on the lower side of the lower substrate 302.

Black stripes 325 are formed on the upper substrate 303. The black stripes 325 are made of, for example, resin black or a metal having relatively low reflectance, such as chromium or the like, and are provided to partition the respective color element layers 313r, 313g and 313b of the R, G and B colors. The width W of the black stripes 325 is set to be larger than the space P1 between the ITO films 319 of the two display dots adjacent to both sides of each of the back stripes 325, i.e., the spaces between the segment electrodes, and equal to the space P2 between the APC films 318.

Referring to FIG. 18, the edges of the ITO films 319 are shown by outer lines denoting the outlines of the segment electrodes 310, and the edges of the APC films 318 are shown by inner lines. Also, the lines showing the outlines of the black stripes 325 are overlapped with the lines showing the edges of the APC films 318. In other words, the width W of the black stripes 325 provided at the boundaries between the color element layers 313r, 313g and 313b is set to be larger than the space P1 between the respective ITO films 319 constituting the segment electrodes 310, and substantially equal to the space P2 between the APC films 318.

FIG. 20 is an enlarged view of the portion shown by reference character S in FIG. 17. FIG. 21 shows the sectional structure taken along line T–T' in FIG. 20. In FIG. 20, the right ends of the three common electrodes 311 in the upper portion are electrically connected to the lead wiring 314. Referring to FIG. 17, the left ends of the two common electrodes 311 in the lower portion are electrically connected to the leading wring 314.

As shown in FIGS. 20 and 21, the ends of the common electrodes 311 on the upper substrate 303 project to outside of the region where the conductive portion 304a of the sealing material 304 is formed. The ends of the lead wirings 314 on the lower substrate 302 are positioned in the region where the conductive portion 304 is formed. The conductive portion 304a contains the conductive particles 330 having a diameter of, for example, about 10 µm, so that the common electrodes 311 on the upper substrate 303 are electrically connected to the lead wirings 314 on the lower substrate 302 through the conductive particles 330.

Like the segment electrodes 310, the lead wirings 314 have a two-layer structure comprising the APC film 318 and the ITO film 319 laminated thereon, the sides of the APC film 318 being coated with the ITO film 319. For the common electrodes 311 (i.e., the two common electrodes 311 in the lower portion shown in FIG. 20) with the left ends connected to the lead wirings 314, dummy patterns 331 are formed at the right ends of the common electrodes 311 within the region where the conductive portion 304a is formed. Like the lead wirings 314, the dummy patterns 311 have a two-layer structure comprising the APC film 318 and the ITO film 319 laminated thereon. Although not shown in the drawing, similarly, for the common electrodes 311 (i.e., the three common electrodes 311 in the upper portion shown in FIG. 20) with the right ends connected to the lead wirings 314, dummy patterns 331 are formed at the left ends of the common electrodes 311 within the region where the conductive portion 304a is formed. In FIG. 20, for the sake of ease of seeing, the outlines of the ITO films are not shown around the APC films constituting the lead wirings 314 and the dummy patterns 331. However, the outlines of the ITO films are actually seen.

In the liquid crystal device 301 of this embodiment, the sealing material 304 functioning as a vertical conductive portion for electrically connecting the common electrodes 311 and the lead wirings 314 is provided in the peripheral portion of the substrates 302 and 303, and the many lead wirings 314 are drawn on the lower substrate 302 so as to overlap the sealing material 304, i.e., to be coated with the sealing material 304. Therefore, the peripheral region of the substrate, i.e., the frame region, can be narrowed, as compared with a conventional liquid crystal device having a structure in which lead wiring is arranged outside a sealing material.

In consideration of narrowing of the frame region, it is ideal to avoid leaving the peripheral portion of the substrate outside the sealing material 304. However, in fact, some margin is required for printing the sealing material 304 on the substrate. However, the sufficient dimension for the margin is as small as, for example, about 0.3 µm, and thus the frame region is not extended to a level causing a practical problem.

In this embodiment, APC having low resistance is used as a material for the lead wirings 314, and thus the pitch of the lead wirings 314 can be decreased, thereby further decreasing the frame region. Furthermore, in this embodiment, the common electrodes 311 on the upper substrate 303 are connected to the lead wirings 314 on the lower substrate 302 through the conductive portion 304a of the sealing material 304, and thus driving of the segment electrodes 310 on the lower substrate 302 and driving of the common electrodes 311 on the upper substrate 303 are assigned to one driving semiconductor element 307 mounted on the lower substrate 302. Therefore, the frame region can be further narrowed, as compared with a liquid crystal device having a structure in which the driving semiconductor element 307 is mounted on each of both the upper and lower substrates.

As shown in FIG. 17, not only the single driving semiconductor element 307 is provided on the lower end of the lower substrate 302, but also many lead wirings 314 are halved between the left and right sides, thereby symmetrizing the shape of the frame region. Therefore, in incorporating the liquid crystal device as a display section in an electronic apparatus, the display section can be arranged at the center of the electronic apparatus, thereby facilitating design for assembling the electronic apparatus and permitting the miniaturization of the whole shape of the electronic apparatus.

As shown in FIGS. 20 and 21, the lead wirings 314 are coated with the nonconductive portion 304b of the sealing materials 304 to prevent the lead wirings 314 from being exposed to the air, thereby preventing corrosion of the lead wirings 314 to improve reliability of the wirings. The APC films 318 have the property that electromigration easily occurs during use. However, in this embodiment, not only the upper surfaces but also the sides of the APC films 318 are coated with the ITO films 319 constituting the segment electrodes 310 and the lead wirings 314. Therefore, it is possible to avoid the problem of corrosion due to moisture adhesion in the manufacturing process, and the problem of electromigration due to contamination of film surfaces.

In this embodiment, since the lead wirings 314 have the laminated structure comprising the APC film 318 and the ITO film 319. The total thickness of the lead wirings 314, i.e., the total thickness of the APC film 318 and the ITO film 319, is, for example, about 0.3 µm. In FIG. 20, a step of about 0.3 µm are produced between a portion of the sealing material 314, in which the lead wirings 314 are formed, and a portion in which the lead wirings 314 are not formed. In this case, the cell gap varies to possibly cause a display defect.

For this problem, in this embodiment, the dummy patterns 331 having the same thickness as the lead wirings 314 are provided at the ends of the common electrodes 311, where the lead wirings 314 are absent, to make the cell gap constant regardless of place, thereby preventing a display defect. Since the lead wirings 314 and the dummy patterns 331 are formed by using the same layer formed in the same step, only a mask pattern may be added for forming the dummy patterns 331 without complicating the manufacturing process.

In this embodiment, furthermore, the black stripes 325 are provided on the upper substrate 303 so as to completely coat the spaces between the respective APC films 318 of the adjacent segment electrodes to prevent a leakage of light, thereby preventing color mixture. As a result, the brightness of a reflective display can be improved, and at the same time, chroma of a transmissive display can be improved to permit a clear color display.

In the embodiment shown in FIG. 17, the driving semiconductor element 307 is mounted directly on the projecting region 309, namely, the COG mounting method is used. However, alternatively, the driving semiconductor element 307 may be provided outside the liquid crystal device 301, an end of a circuit board, for example, a FPC (Flexible Printed Circuit), may be connected to the external connecting terminals 316, and the output terminals of the driving semiconductor element 307 may be connected to the other end of the FPC. In this case, the output signals of the external semiconductor element 307 can be supplied to each of the electrodes 310 and 311 formed on the substrates 302 and 303 through the external connecting terminals 316, the lead wirings 314 and 315.

In this embodiment, as shown in FIG. 17, the portions of the sealing material 304 along the upper and lower sides of each of the substrates 302 and 303 comprise only the nonconductive portion 304b, while the portions along the right and left sides of each of the substrates 302 and 303 have a two-layer structure comprising the conductive portion 304 and the nonconductive portion 304b. The lead wirings 314 formed on the lower substrate 302 are arranged in the region where the nonconductive portion 304b is formed.

The conductive portion 304a provided on the peripheral side of each of the substrates 302 and 303 contains the conductor such as the conductive particles 330 or the like, and functions as the seal around the liquid crystal as well as the vertical conductive portion. On the other hand, the nonconductive portion 304b provided nearer to the central portion of the substrates 302 and 303 than the conductive portions 304a does not contain the conductor, but contains the gap material 332 for securing the cell gap in place of the conductor. Therefore, the nonconductive portion 304b does not exhibit the function as the vertical conductive portion, but has the function to seal the liquid crystal.

The width of the sealing material 304 necessary for sealing the liquid crystal is determined to some extent. Generally, the width is possibly about 0.5 mm. Assuming that the whole sealing material 304 comprises only the conductive portion 304a, a wide area can be obtained for vertical conduction, thereby causing the advantage that stable conduction between the common electrodes 311 and the lead wirings 314 can be secured. In this case, the pitch of the common electrodes 311 is large, and thus no short circuit occurs.

However, the pitch of the lead wirings 314 is narrow, and thus when the lead wirings 314 are arranged in the region where the conductive portion 304a is formed, a short circuit possibly occurs between the leading wrings 314. Therefore, with the sealing material 304 comprising only the conductive portion 304a, the lead wirings 314 must be arranged inside the sealing material 304 in order to avoid a short circuit between the lead wirings 314. This increases the planar dimensions of the liquid crystal device by an amount corresponding to the lead wirings 314 arranged apart from the sealing material 304, thereby failing to satisfy the requirement to narrow the frame region of the liquid crystal device.

On the other hand, in this embodiment, the conductive portion 304a and the nonconductive portions 304 function to seal the liquid crystal, and thus the width of the sealing material necessary for sealing the liquid crystal is shared between the conductive portion 304a and the nonconductive portion 304b. More specifically, in consideration of the securement of reliability of vertical conduction, for example, the width S1 of the conductive portion 304a is 0.2 mm, and the width S2 of the nonconductive portion 304b is 0.3 mm, as shown in FIG. 20.

In this case, the total width S of the sealing material is 0.5 mm so that the liquid crystal can be securely sealed with the sealing material 304. Since the nonconductive portion 304b has no conductivity, the lead wirings 314 are arranged in the region where the nonconductive portion 304b is formed apart from the region where the conductive portion 304a is formed, thereby preventing a short circuit between the lead wirings 314.

More specifically, when the dimension E from the edge of the substrate to the conductive portion 304a is 0.3 mm, the lead wirings 314 cannot be arranged in the region of 0.5 mm corresponding to the total width of the dimension E from the edge of the substrate and the width S1 of the conductive portion 304a, but the lead wirings 314 can be arranged nearer to the central portion of the substrate. Namely, the frame region can be narrowed by 0.3 mm on one side, i.e., 0.6 mm on both sides, as compared with the case in which the whole sealing material 304 comprises the conductive portion 304a. In this way, by using the sealing material 304 having the double structure shown in FIG. 20, the frame region of the liquid crystal of this embodiment can be further narrowed.

In forming the double-structure sealing material 304, bubbles enter the spaces between the conductive portion 304a and the nonconductive portion 304b to possibly deteriorate reliability of the seal around the liquid crystal. In order to prevent bubbles from entering the sealing material 304, for example, the method shown in FIG. 22 can be used.

Figure 22:
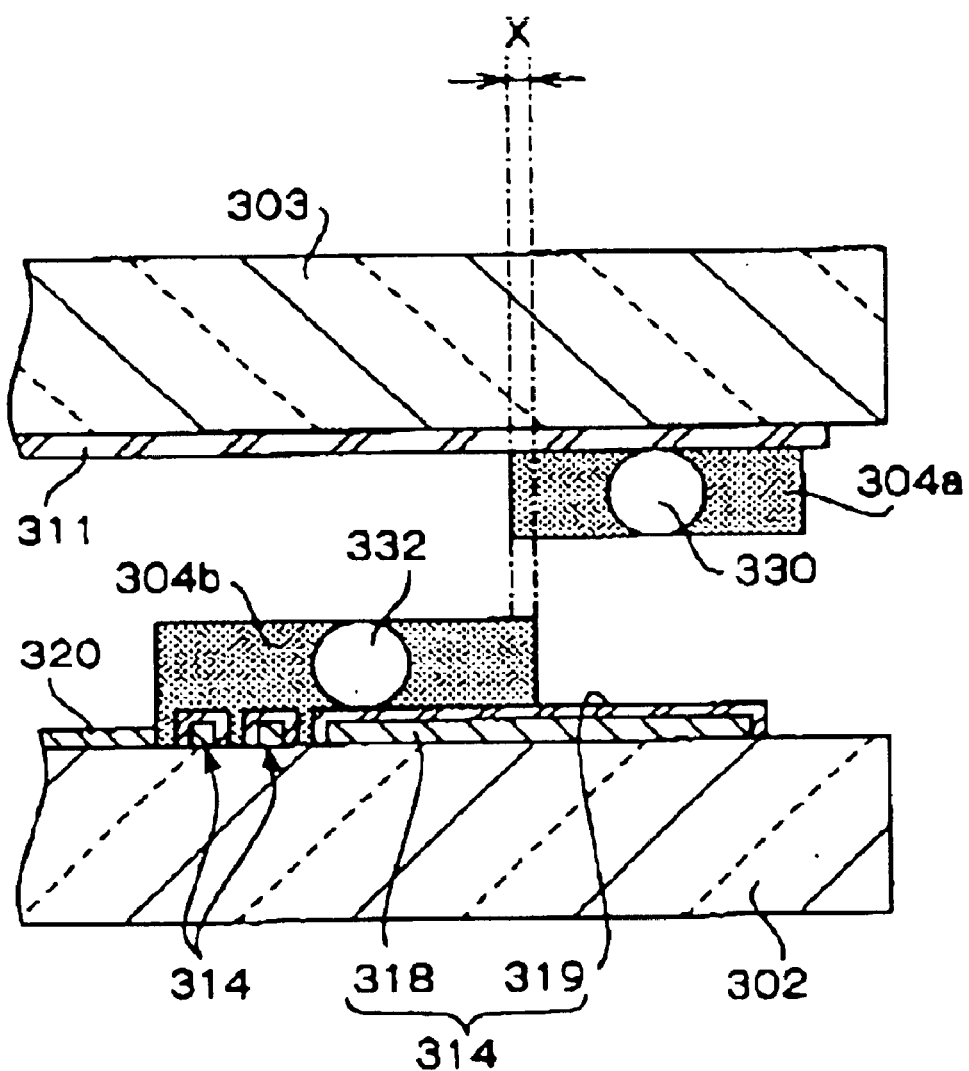
FIG. 22 is a sectional view showing an example of a method of producing the seal structure shown in FIG. 21.

That is, in FIG. 22, the resin material for the conductive portion 304a is printed on the upper substrate 303, while the resin material for the nonconductive portion 304b is printed on the lower substrate 302. After printing, both substrate 302 and 303 are bonded together so that the conductive portion 304a and the nonconductive portion 304b are connected to form the sealing material 304, as shown in FIG. 21.

In bonding the substrates together, as shown in FIG. 22, an inner peripheral portion of the conductive portion 304a, which has dimension X, and an outer peripheral portion of the nonconductive portion 304b, which has dimension X, are overlapped with each other. In other words, the dimensions of both portions are preferably overlapped with each other. Consequently, the inner periphery of the conductive portion 304s and the outer periphery of the nonconductive portion 304b can be bonded without a space therebetween over the whole circumference to completely prevent the occurrence of bubbles.

(Electrooptic Device of Sixth Embodiment)

Figure 23:
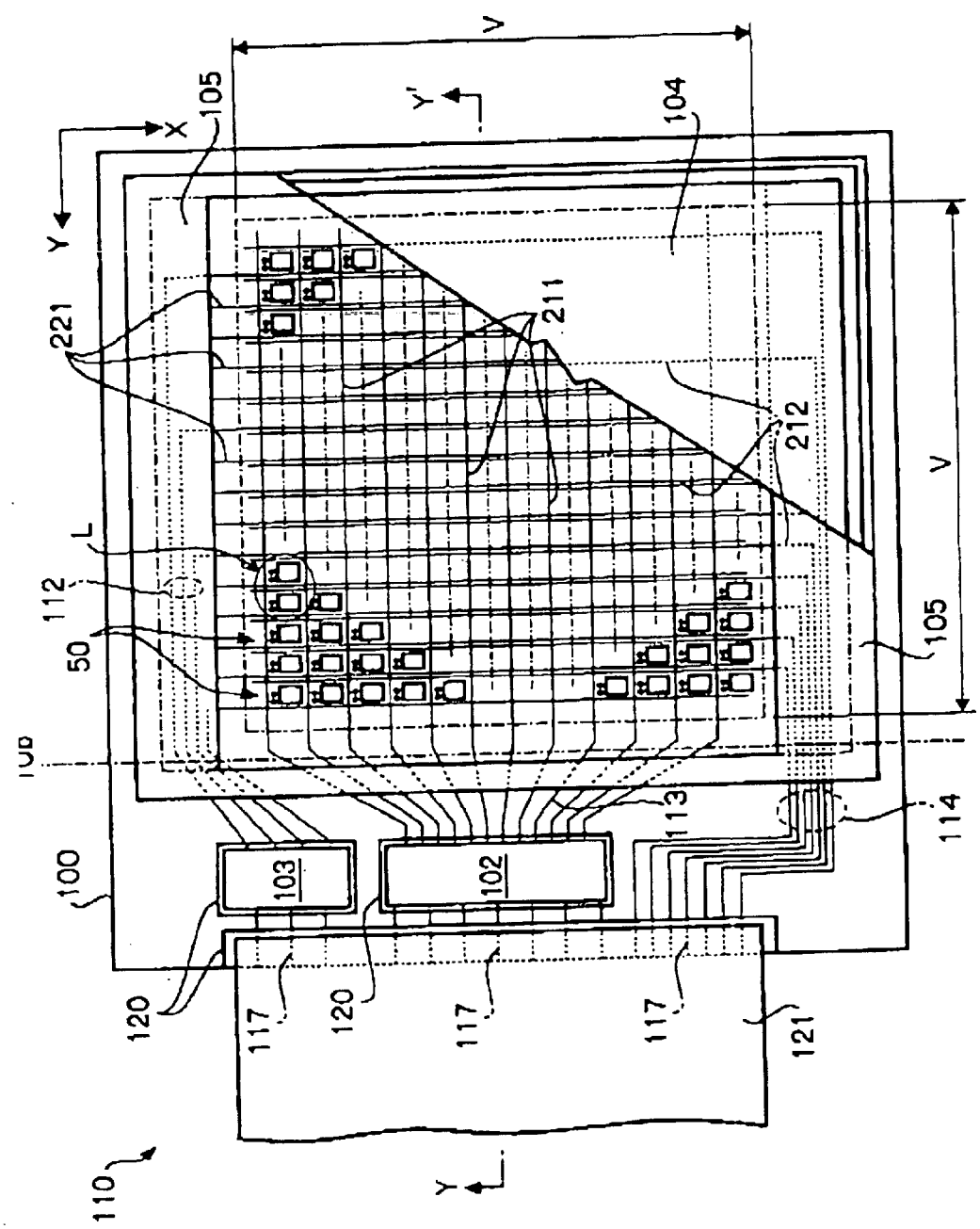
FIG. 23 is a partially broken-out plan view showing a still further embodiment in which the present invention is applied to a liquid crystal as an example of electrooptic devices.
Figure 24:
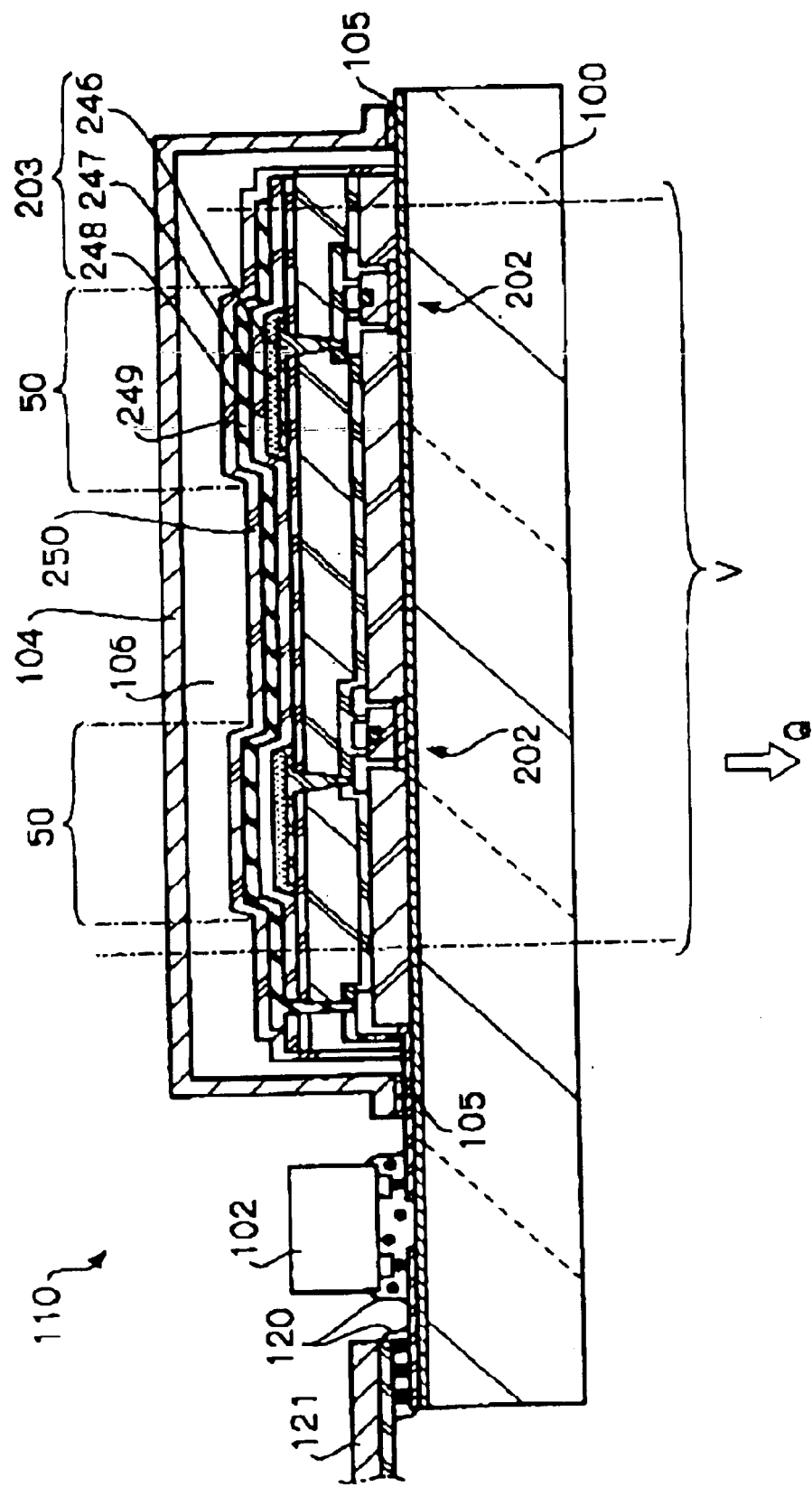
FIG. 24 is a sectional view showing the sectional internal structure of the liquid crystal device taken along line Y–Y' in FIG. 23.

FIG. 23 shows an embodiment in which the present invention is applied to an active matrix EL (Electroluminescence) device 110 as an example of electrooptic devices. FIG. 24 shows the sectional structure of the EL device 110 taken along line Y–Y' in FIG. 23.

In these drawings, an area where a plurality of pixels are formed, i.e., a display area V, is formed on a substrate 100. Also, a gate-side driving IC 102 and a source-side driving IC 103 are mounted on the substrate 100 by means of ACF 120. Furthermore, FPC 121 is connected to the side edge of the substrate 100 by means of ACF 120. Output terminals of the FPC 121 and input terminals of the driving ICs 102 and 103 are connected through external connecting terminals 117 formed on the substrate 100.

Each of the driving ICs 102 and 103 contains, for example, a shift register, a buffer, a level shifter, a sampling circuit, etc. For digital driving, a signal converting circuit such as a D/A converter or the like can also contained in each of the ICs 102 and 103. A circuit corresponding to each of the driving ICs 102 and 103 can be formed on the substrate 100 at the same time as formation of semiconductor elements, and the like in the display area V. Besides the display area V, and circuits corresponding to the driving ICs 102 and 103, and the like, logical circuit such as a signal dividing circuit, a D/A converter circuit, an operational amplifier circuit, a γ-correction circuit, and the like can also be formed directly on the substrate 100. Furthermore, a memory section, a microprocessor, and the like can be formed directly on the substrate 100.

A housing 104 is secured to the substrate 100 with an adhesive 105. The housing 104 is provided to surround at least the display area V. The housing 104 has a shape having a recessed portion having an internal height dimension larger than that of the display area V, or a sheet-like shape having no recessed portion. The housing 104 secured with the adhesive 105 forms a closed space around the display area V in combination with the substrate 100. At the same time, a plurality of EL elements formed in the display area V are completely sealed in the closed space, and completely shut off from the outside air.

As the material of the housing 104, an insulating material such as glass, a polymer, or the like is preferably used. Examples of the material include amorphous glass such as borosilicate glass, quartz, and the like; crystallized glass; ceramic glass; organic resin, for example, acryl resins, styrene resins, polycarbonate resins, epoxy resins, and the like; silicone resins; and the like. When the adhesive 105 comprises an insulating material, a metal material such as a stainless alloy or the like can also be used.

As the adhesive 105, an adhesive such as an epoxy resin, an acrylate resin, or the like can be used. Also, a thermosetting resin or optical setting resin can be used as the adhesive. However, the material must be impermeable to oxygen and moisture as much as possible.

In FIG. 24, the space 106 between the housing 104 and the substrate 100 is preferably filled with an inert gas such as argon, helium, nitrogen, or the like. Besides the gas, an inert liquid, for example, a liquid fluorocarbon such as perfluoroalkane, or the like can also be used. It is also effective to place a drying agent in the space 106. As the drying agent, for example, barium oxide is possibly used.

Figure 25:
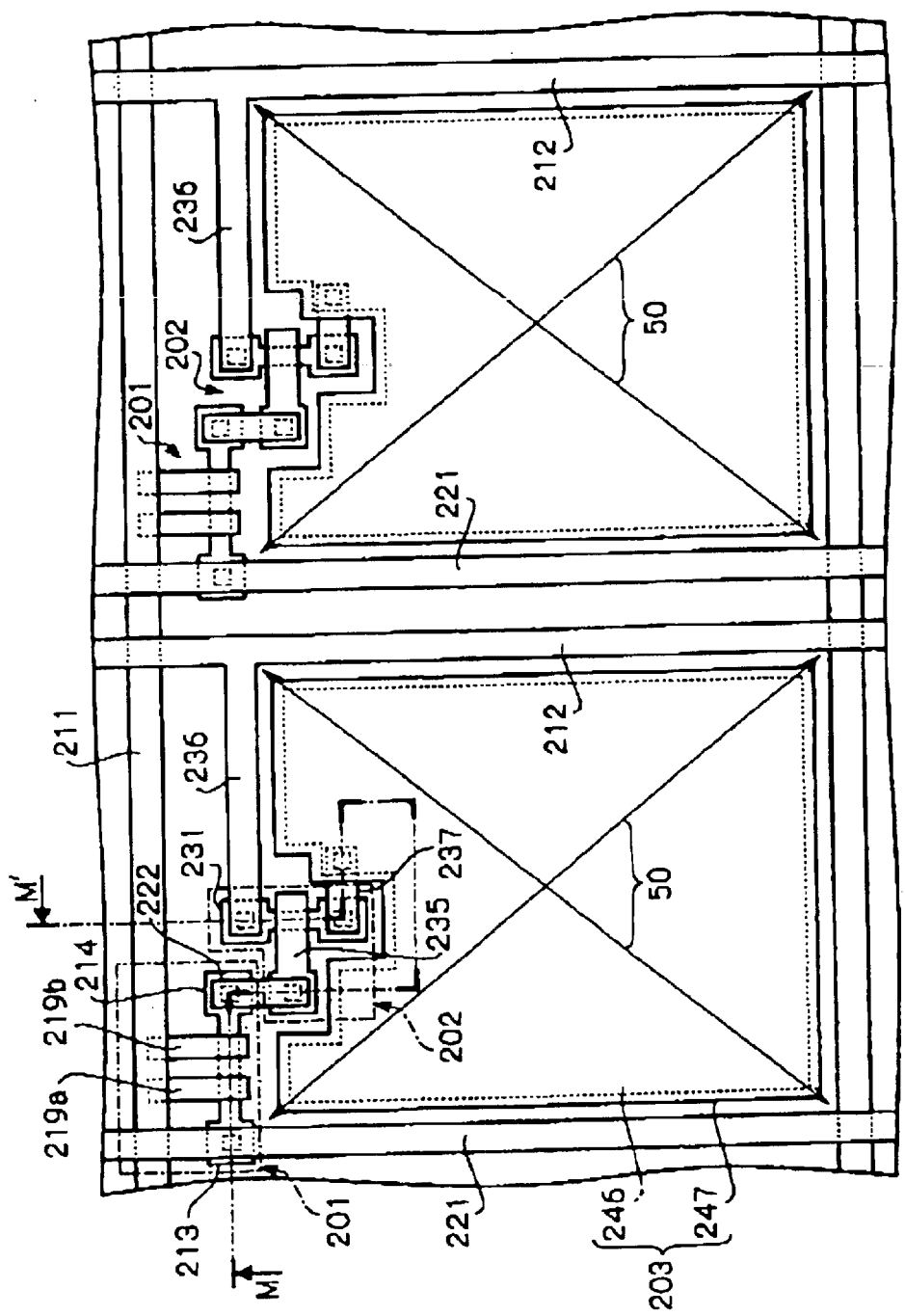
FIG. 25 is an enlarged plan view showing the display dot portion shown by arrow L in FIG. 23.
Figure 26:
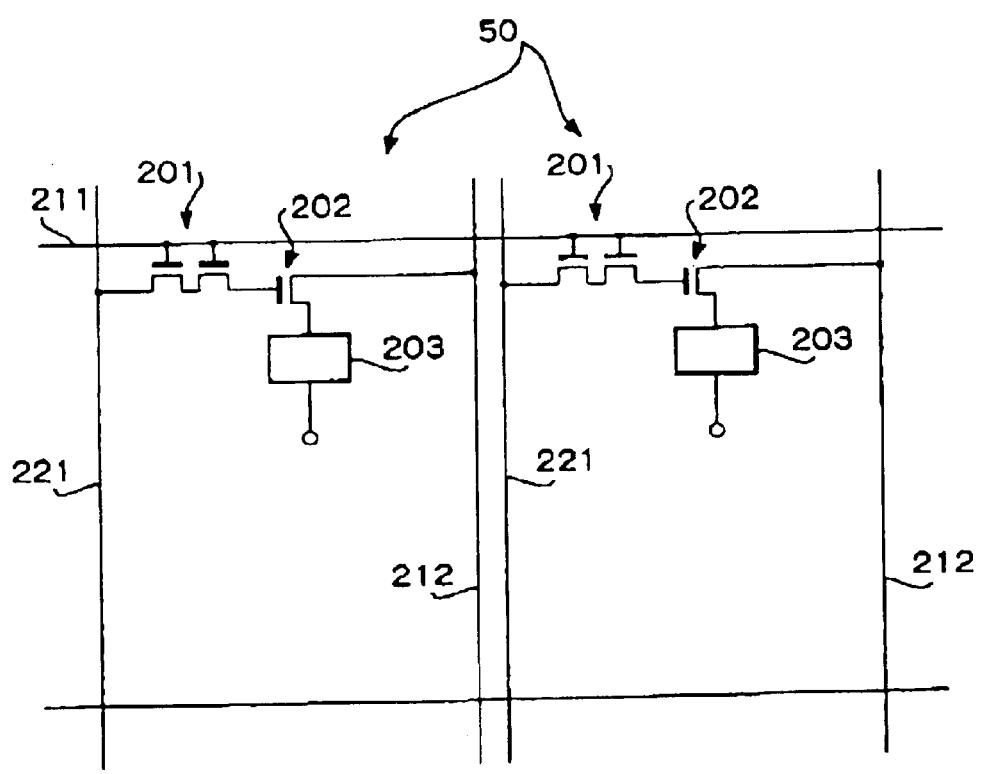
FIG. 26 is a drawing showing electrical equivalent circuits corresponding to the structure shown in FIG. 25.

As shown in FIG. 23, a plurality of individual display dots 50 are arranged in a matrix in the display area V. FIG. 25 shows the two adjacent display dots 50 shown by arrow L in FIG. 23. FIG. 26 shows equivalent circuits in the electrical circuit configuration of the display dots.

As shown in FIGS. 25 and 26, each of the display dots 50 comprises a switching TFT 201 functioning as a switching element, and a current control TFT 202 functioning as a current control element for controlling the quantity of the current flowing through an EL element. The source of the switching TFT 201 is connected to source wiring 221, and the gate of the switching TFT 201 is connected to gate wiring 211, and the drain is connected to the gate of the current control TFT 202.

The source of the current control TFT 202 is connected to a current supply line 212, and the drain is connected to an EL element 203. The EL element 203 is a light emitting element having a structure in which an EL layer containing a luminescent layer is held between an anode and a cathode. In FIG. 25, each of pixel electrodes 246 is shown as a substantially rectangular anode, and an El layer 247 containing the luminescent layer is laminated on the pixel electrode 246. Furthermore, a cathode (not shown in FIG. 25) as a common electrode common to the display dots 50 is laminated on the EL layer 247 to form the EL elements 203 having the laminated structure.

In FIG. 23, the source wiring 221 extends in the longitudinal direction (i.e., the X direction) of the drawing to enter the adhesive 105, i.e., a layer below the adhesive 105, and is connected to wiring 112 in the adhesive 105. The wiring 112 extends in the adhesive 105 in the lateral direction (i.e., the Y direction) of the drawing, crosses the left side of the adhesive 105, and projects outward from the housing 104 to be connected to output terminals of the source driving IC 103.

The gate wiring 211 extends in the Y direction shown in FIG. 23, and is connected to wiring 113 near the left side of the adhesive 105. The wiring 113 crosses the left side of the adhesive 105 and projects outward from the housing 104 to be connected to output terminals of the gate driving IC 102.

The current supply lines 212 extend in the Y direction shown in FIG. 23, and enter the adhesive 105, i.e., a layer below the adhesive 105, in the lower portion of FIG. 23, to be connected to wiring 114 within the adhesive 105. The wiring 114 extends in the Y direction within the adhesive 105, crosses the left side of the adhesive 105 and projects outward from the housing 104 to be connected to output terminals of the FPC 121 through the external connecting terminals 117.

Figure 27:
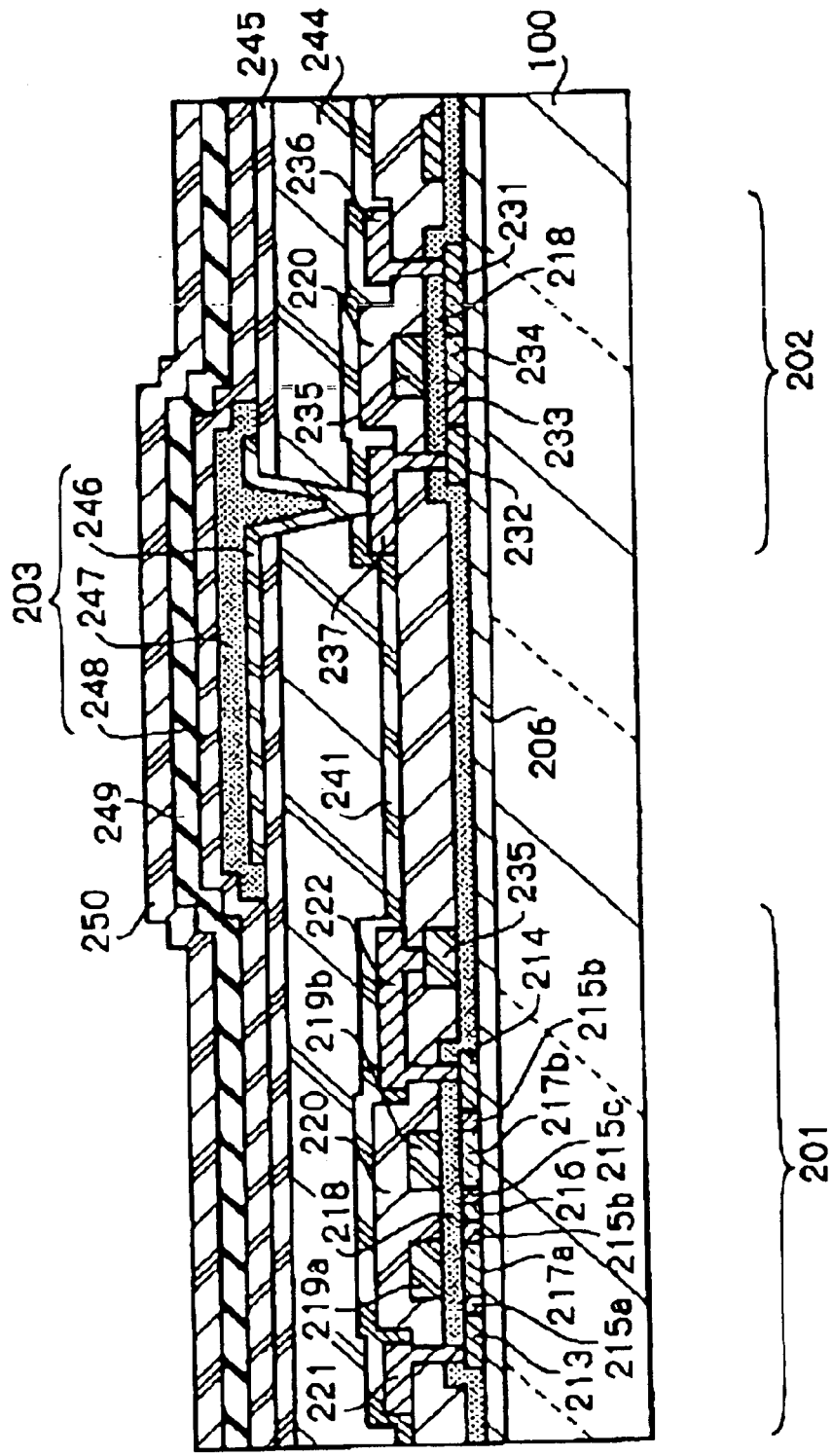
FIG. 27 is a sectional view showing the sectional structure of TFTs taken along line M–M' in FIG. 25.

FIG. 27 shows the sectional structure of the active element portion for driving the E1 elements, taken along line M–M' in FIG. 25. In FIG. 27, an insulating film 206 is formed as an underlying film on the substrate 100. The substrate 100 comprises, for example, a glass substrate, a glass ceramic substrate, a quartz substrate, a silicon substrate, a ceramic substrate, a metal substrate, a plastic substrate, a plastic film, or the like.

The underlying film 206 is particularly effective for the use of a substrate containing moving ions or a conductive substrate. However, when a quartz substrate is used as the substrate 100, the underlying film 206 may be not provided. As the underlying film 206, for example, an insulating film containing silicon may be used. Also, the underlying film 206 is preferably provided with the radiating function to releasing heat produced in the TFTs.

In this embodiment, two TFTs, specifically the switching TFT 201 functioning as the switching element, and the current control TFT 202 functioning as the current control element for controlling the quantity of the current flowing to the EL element, are provided in each of the display dots. In this embodiment, both of the TFTs are formed as n-channel TFTs, but both or either of the TFTs may be a p-channel TFT.

Each of the switching TFTs 201 comprises an active layer including the five types of components such as a source region 213, a drain region 214, LDD (Lightly Doped Drain) regions 215a, 215b, 215c, 215d, a high-concentration impurity region 216, and channel formation regions 217a and 217b. Each of the switching TFTs 201 also comprises a gate insulating film 218, gate electrodes 219a and 219b, a first interlayer insulating film 220, the source wiring 221, and the drain wiring 222.

As shown in FIG. 25, the gate electrodes 219a and 219b form a double gate structure in which the electrodes are electrically connected by the gate wiring 211 made of a material having lower resistance than the gate electrodes 219a and 219b. Of course, besides the double gate structure, a triple gate structure or the like, i.e., a multi-gate structure, may be used, which comprises an active layer having not less than two channel formation regions connected in series.

The active layer comprises a semiconductor film containing a crystal structure, i.e., a single-crystal semiconductor film, a polycrystal semiconductor film, or a microcrystal semiconductor film. The gate electrodes 219a and 219b, the source wiring 221, and the drain wiring 222 can be formed by using any type of conductive film. In each of the switching TFTs 201, the LDD regions 215a to 215d are provided so as not to overlap the gate electrodes 219a and 219b through the gate insulating film 218. This structure is very effective for decreasing the off-state current value.

In FIG. 27, each of the current control TFTs 202 comprises an active layer including the four types of components such as a source region 231, a drain region 232, a LDD region 233 and a channel formation region 234, a gate insulating film 218, a gate electrode 235, a first interlayer insulating film 220, source wiring 236, and drain wiring 237. The gate electrode 235 has a single-gate structure, but a multi-gate structure may be used.

Referring to FIG. 27, the drain of the switching TFT 201 is connected to the gate of the current control TFT. More specifically, the gate electrode 235 of the current control TFT 202 is electrically connected to the drain electrode 214 of the switching TFT 201 through the drain wiring 222. The source wiring 236 is connected to the current supply lines 212.

The current control TFTs 202 supply the current for emitting light from the EL elements 203, and at the same time, control the quantity of the current to permit a grayscale display. Therefore, in order to prevent deterioration even when a current is passed, it is necessary to take a measure against deterioration due to hot carrier injection. Although, in a black display, the current control TFTs 201 are turned off, a clear black display cannot be performed with a high off-state current value, thereby causing deterioration in contrast. Therefore, the off-state current value is preferably kept down.

Referring to FIG. 27, a first passivation film 241 is formed on the first interlayer insulating film 220. The first passivation film 241 comprises, for example, an insulating film containing silicon. The first passivation film 241 functions to protect the TFTs from alkali metals and moisture. The EL layers finally provided above the TFTs contain alkali metals such as sodium or the like. Namely, the first passivation film 241 functions as a protecting layer for preventing the alkali metals from entering the TFT side.

By imparting the radiating function to the first passivation film 241, heat deterioration of the EL layers can also be prevented. In the structure shown in FIG. 27, light is incident on the substrate 100, and thus the first passivation film 241 must have light translucency. When an organic material is used for the EL layers, the EL layers are deteriorated by combination with oxygen, and it is thus preferable to avoid using an insulating film easily releasing oxygen.

A second interlayer insulating film 244 is formed on the first passivation film 241 to coat the TFTs. The second interlayer insulating film 244 functions to planarize the steps formed by the TFTs. As the second interlayer insulating film 244, for example, an organic resin film of polyimide, polyamide, acryl polymer, or the like can be used. Of course, an inorganic film can also be used if planarization can be sufficiently performed.

The EL layers are very thin, and thus the presence of the steps on the surface on which the EL layers are formed causes light emission defects in some cases. Therefore, in order to cause the EL layers formed on the second interlayer insulating film 244 to normally function, it is important to planarize the steps formed by the TFTs by the second interlayer insulating film 244.

A second passivation film 245 is formed on the second interlayer insulating film 244. The second passivation film 245 exhibits the function to prevent permeation of the alkali metals diffusing from the EL elements. The second passivation film 245 can be formed by using the same material as the first passivation film 241. Also, the second passivation film 245 preferably functions as a radiating layer for releasing heat produced in the EL elements, and this radiating function can prevent storage of heat in the EL elements.

Furthermore, the pixel electrodes 246 are formed on the second passivation film 245. Each of the pixel electrodes 246 comprises, for example, a transparent conductive film, and functions as an anode of the EL element. After contact holes, i.e., openings, are formed in the second passivation film 245, the second interlayer insulating film 244 and the first passivation film 241, the pixel electrodes 246 are formed to be connected to the drain wiring 237 of the current control TFTs 202 through the formed contact holes.

Next, the EL layers 247 are formed on the pixel electrodes 246. Although the EL layers 247 have a single layer structure or multilayer structure, the multilayer structure is generally used. In each of the EL layers 247, a hole injection layer, a hole transport layer or a luminescent layer is formed as a layer in direct contact with the pixel electrode 246.

In the use of a two-layer structure comprising the hole transport layer and the luminescent layer, the hole transport layer can be formed by using, for example, polyphenylenevinylene. As the luminescent layer, cyanopolyphenylenevinylene can be used for a red luminescent layer, polyphenylenevinylene can be used for a green luminescent layer, and polyphenylenevinylene or polyalkylphenylene can be used as a blue luminescent layer.

Then, a cathode 248 is formed on the EL layers 247 formed as described above, and a protecting electrode 249 is formed on the cathode 248. The cathode 248 and the protecting electrode 249 are formed by, for example, a vacuum deposition method. When the cathode 248 and the protecting electrode 249 are continuously formed without being opened to the air, deterioration in the EL layers 247 can be suppressed. Each of the El elements 203 is the light emitting layer comprising the pixel electrode 246, the EL layer 247 and the cathode 248.

As the cathode 248, a material containing magnesium (Mg), lithium (Li) or calcium (Ca) having a low work function can be used. The protecting electrode 249 is provided for protecting the cathode 248 from outside moisture and the like, and a material containing, for example, aluminum (Al) or silver (Ag) can be used for the protecting electrode 249. The protecting electrode 249 also has a radiating effect.

The structure shown in FIG. 27 is a monochromatic light emission-system structure in which one EL element 203 corresponding to any one of R, G and B colors is formed in correspondence with each of the display dots 50. However, instead of the monochromatic light emission system, a color display can be performed by using a light emission system in which white light emitting elements are combined with a color filter, a system in which blue or blue-green light emitting elements are combined with a fluorescent material, or a system in which EL elements corresponding to R, G and B are superposed by using a transparent electrode as a cathode. Of course, a monochrome display can be performed by forming a white light emitting layer comprising a single layer.

A third passivation film 250 is formed on the protecting electrode 249. The third passivation film 250 may be caused to function to protect the EL layers 247 from moisture, and exhibit the radiating function like the second passivation film 245 according to demand. In use of an organic material for the El layers, the organic material has the probability of deterioration due to combination with oxygen, and thus it is preferable to avoid using an insulating film easily releasing oxygen as the third passivation film 250.

In this embodiment, the EL device 110 is constructed as described above, and thus either a scanning signal or data signal is supplied to the gate wiring 211 by the gate-side driving circuit 102 shown in FIG. 23, the other of the scanning signal and the data signal being supplied to the source wiring 221 by the source-side driving circuit 103. On the other hand, a current for light emission is supplied to the current control TFT 202 in each of the display dots 50 by the current control line 212.

Some of the plurality of display dots 50 arranged in a matrix in the display area V are appropriately selected based on the data signal. During the selection period, the switching TFTs 201 are turned on to write a data voltage, while during the non-selection period, the TFTs 202 are turned off to maintain the voltage. By this switching and storage operation, the plurality of display dots 50 are appropriately selectively illuminated so that an image of a character, a numeric character or a figure is displayed on the rear side of the drawing of FIG. 23, i.e., in the direction shown by arrow G in FIG. 24, by a collection of the luminescent points.

Referring to FIG. 23, signals are transmitted to the source wiring 221 through the wiring 112. Also, signals are transmitted to the gate wiring 211 through the wiring 113, and a current is supplied to the current supply lines 212 through the wiring 114. In this embodiment, in the housing 104 for cutting off the sealed inside of the EL device 110 from the outside, a wiring boundary 10b is set near the side corresponding to the portion of the housing 104, from which the wirings 112, 113 and 114 are drawn out.

With respect to the wirings 112, 113 and 114, the portion present on the wiring lead-out side (i.e., the left side in FIG. 23) of the wiring boundary 10b has a two-layer sectional structure comprising the first wiring layer 181 and the third wiring layer 183 laminated thereon, as shown in FIG. 8(d). On the other hand, the portion present on the display area side of the wiring boundary 10b has the three-layer sectional structure comprising the first wiring layer 181, the second wiring layer 182 laminated thereon, and the third wiring layer 183 laminated on the second wiring layer 182, as shown in FIG. 8(c). Namely, the layer structure of the wirings 112, 113 and 114 inside the wiring boundary 10b is different from that outside the wiring boundary 10b.

For example, in consideration of the case in which the second wiring layer 182 present only inside (on the display area side) the wiring boundary 10b is made of a material having low resistance and easily be corroded, the wiring resistance value can be kept down by containing the second wiring layer 182 in wiring, thereby permitting a stable image display by the EL device 110.

Furthermore, even when the second wiring layer 182 is made of a material easy to corrode, the region where the second wiring layer 182 is provided is limited to the region shout off from the outside by the housing 104, and thus the second wiring layer 182 is not exposed to the outside air. Therefore, it is possible to securely prevent the occurrence of a display defect due to the occurrence of corrosion over the whole wiring accompanying the second wiring layer 182.

Furthermore, in this embodiment, the portions of the wirings 112 and 114, which extend in the Y direction, are widely coated with the adhesive 105, and thus these wirings can be securely prevented from being exposed to the air, thereby securely preventing the problem due to exposure to the air, for example, the corrosion, a short circuit, and the like. Although this problem is possibly produced in the process for manufacturing an El device after the wiring 112 and the like are formed on the substrate 100, the problem can be prevented in an early stage by coating the wiring 112 and the like with the adhesive 105 as an early stage as possible.

(Other Embodiments)

Although the present invention is described with reference to the preferred embodiments, the present invention is not limited to these embodiments, and various changes can be made in the scope of the claims of the present invention.

For example, an electrooptic device is not limited to a liquid crystal device, and an EL device, and any device requiring the formation of wiring on a substrate can be considered.

As described above, the present invention can simply and securely prevent various problems due to exposure of lead wiring to the air. The entire disclosures of Japanese Patent Application Nos. 2001-117463 filed Apr. 16, 2001, 2001-148298 filed May 17, 2001, 2001-148299 filed May 17, 2001, and 2002-100569 filed Apr. 2, 2002 are incorporated by reference herein.

What is claimed is:

1. An electrooptic device comprising:
   a first substrate;
   a second substrate opposed to the first substrate;
   an electrode formed on the second substrate, each electrode having a first conductive portion at an end of the electrode;
   liquid crystal disposed between the first and second substrates;
   wirings provided along one side of the first substrate to extend from a first end of the first substrate to a second end of the first substrate, each wiring having a second conductive portion at an end of the wiring, the second conductive portion opposing the first conductive portion of the corresponding electrode at a conduction region;
   a coating layer coating the wirings and comprising a sealing material formed to surround the liquid crystal; and
   a conductive materal contained in the sealing material;
   wherein the wirings are connected to the electrodes through the conductive material;
   wherein all of the wirings enter said sealing material at a point distal to said conduction region and extend to said conduction region completely covered by said sealing material; and
   wherein the sealing material includes a conductive sealing portion containing the conductive material and a nonconductive sealing portion not containing the conductive material, the conductive sealing portion is outboard of all nonconductive sealing portions, the wirings are coated with the nonconductive portion, and the first conductive portion is connected to the second conductive portion at the conductive sealing portion of the sealing material.

2. An electrooptic device according to claim 1;
   wherein a plurality of electrodes are provided;
   a plurality of wirings are provided to be respectively electrically connected to the plurality of electrodes;
   at least one of the wirings is electrically connected to the corresponding electrode on one of the sides of the first substrate; and
   the other wirings of the plurality of wirings are electrically connected to the corresponding electrodes on the side opposite to the one side.

3. An electrooptic device according to claim 1, wherein an end of the wiring is connected to an external connection circuit.

4. An electrooptic device according to claim 1, further comprising:
   a thin film diode comprising a first metal film, an insulating film and a second metal film, which are laminated on the first substrate;
   wherein the wiring is formed by using the same layer as at least one of the first metal film and the second metal film.

5. An electrooptic device according to claim 4, further comprising a pixel electrode connected to the thin film diode;
   wherein the wiring is formed by using the same layer as at least one of the first metal film, the second metal film, and the pixel electrode.

6. An electrooptic device according to claim 1, further comprising wiring formed on the second substrate;
   wherein the wiring comprises a coated portion coated with one side of the sealing material and extended in substantially the same direction as the one side.

7. An electrooptic device according to claim 1, wherein the sealing material includes a portion coating the wiring and a portion not coating the wiring;
   wherein the portion coating the wiring is formed to be wider than the portion not coating the wiring.

8. An electronic apparatus comprising an electrooptic device according to claim 1.

9. An electrooptic device according to claim 1, wherein the second conductive portion extends from the inner edge of the coating layer beyond the coating layer.

10. An electrooptic device comprising:
    a first substrate;
    a second substrate opposed to the first substrate;
    liquid crystal disposed between the first and second substrates;
    a sealing material having an inner edge that surrounds the liquid crystal, the sealing material including a conductive material; and
    a plurality of lines disposed at a second-substrate side of the liquid crystal and each including a display region portion located within the inner edge of the sealing material and a line conductive portion at one end of the corresponding display region portion; and
    a plurality of wirings disposed at a first-substrate side of the liquid crystal, the wirings each including an extending portion and a wiring conductive portion, the extending portions extending in an extension direction following an edge of the first substrate, the wiring conductive portions extending from an end of corresponding extending portions toward the inner edge of the sealing material in a direction that intersects said edge of the first substrate, the wiring conductive portions opposing corresponding line conductive portions and being brought into electrical connection with the corresponding line conductive portions through the conductive material of the sealing material, the wiring conductive portions befin wider in the extension direction than the extending portions are in a direction substantially perpendicular to the extension direction, all of the wirings begin covered by the sealing material from where the extending portions over lap with the sealing material to wiring conductive portions;
    wherein the line conductive portions of the lines are wider in the extension direction than the display region portions of the lines, one edge of line conductive portion being substantially a linear extension of an edge of the corresponding display region portion and an opposite edge of each line conductive portion being shifted out of alignment in the extension direction with the opposite edge of the corresponding display region portion.

11. An electrooptic device according to claim 10, wherein the wire conductive portions extend in opposition with corresponding line conductive portions to positions inboard of the inner edge of the sealing material.

12. An electrooptic device according to claim 10, wherein the sealing material includes conductive regions including the conductive material and non-conductive regions that do not include the conductive material, the wirings being covered by both the conductive and the non-conductive regions of the sealing material, the wiring conductive portions and corresponding line conductive portions being brought into electrical connection with each other at the conductive regions of sealing material.

13. An electrooptic device according to claim 10, wherein a portion of the wirings are in electrical connection with the corresponding lines at the edge of the first substrate, a remainder of the wirings begin in electrical connection with the corresponding lines at an opposite edge of the first substrate that is opposite from the edge of the first substrate.

14. An electrooptic device according to claim 10, wherein the conductive portions of the lines are wider than portions of the lines in a display region.

15. An electrooptic device according to claim 10, further coprising:

a thin-film diode including a first metal layer, an insulation film, and a second metal layer stacked in this order; and a pixel electrode connected to the thin-film diode, the wirings being formed from the same layer as at least one of the first metal layer, the second metal layer, and the pixel electrode.

16. An electrooptic device according to claim 15, wherein at least one of the first metal layer, the second metal layer, and the pixel electrode is formed from a material having a higher ionization tendency than the materials of the other two layers.

17. An electrooptic device according to claim 16, wherein the material having a higher ionization tendency has a lower resistance than the materials of the other two layers.

18. An electrooptic device to claim 10, further comprising other wirings formed on at the second-substrate side of the liquid crystal, the other wirings being covered by the sealing material.

19. An electrooptic device according to claim 10, wherein the seal material has a substantial frame shape first sides and second sides, the first sides having a greater thickness in a first direction outboard from a display region than the second sides having in a second direction outboard from the display region, the first direction and the second direction being substantially perpendicular to each other, the wirings being covered by the first sides of the sealing material.

20. An electrooptic device comprising:

a first substrate;

a second substrate opposed to the first substrate;

liquid crystal disposed between the first and second substrates;

a sealing material having an inner edge that surrounds the liquid crystal, the sealing material including a conductive material;

a plurality of lines disposed on the second substrate, each line including a first edge that is at least substantially perpendicular to said inner edge of said sealing material and a second edge that is at least substantially perpendicular to said inner edge of said sealing material;

a line conductive portion that is integral with said line and positioned on an inner surface of the second substrate, said line conductive portion including a third edge that is at least substantially perpendicular to said inner edge of said sealing material and a fourth edge that is at least substantially perpendicular to said inner edge of said sealing material, said third edge is aligned with said first edge and said fourth edge is offset from said second edge; and a plurality of wirings disposed on an inner surface of the first substrate, the wirings each including a narrow elongated leg portion that ends in a wilder transversely extending foot portion, the leg portions lying in a direction generally paralleling an edge of the first substrate, the foot portions on the first substrate opposing the corresponding line conductive portions on the second substrate and being brought into electrical connection therewith through the conductive material of the sealing material, substantially all of the leg portions of the wirings and at least part of the foot portions being covered by the sealing material.

* * * * *

UNITED STATES PATENT AND TRADEMARK OFFICE
CERTIFICATE OF CORRECTION

| | | |
|---|---|---|
| PATENT NO. | : 7,088,417 B2 | Page 1 of 2 |
| APPLICATION NO. | : 10/123079 | |
| DATED | : August 8, 2006 | |
| INVENTOR(S) | : Motohiro Kamijima et al. | |

It is certified that error appears in the above-identified patent and that said Letters Patent is hereby corrected as shown below:

TITLE PAGE (54), Substitute Title: --ELECTROOPTIC DEVICE HAVING CONDUCTIVE SEAL MATERIAL AND PARTICULAR WIRING STRUCTURE, METHOD OF MANUFACTURING THE SAME, AND ELECTRONIC APPARATUS--

TITLE PAGE (56), References Cited, U.S. PATENT DOCUMENTS, add --6,744,484   6/2004   Yoshino et al. .....349/153--

TITLE PAGE (56), References Cited, U.S. PATENT DOCUMENTS, add --2001/0022640   9/2001   Nakahara .....349/123--

TITLE PAGE (56), References Cited, FOREIGN PATENT DOCUMENTS, add --KR   1999-022983   3/1999--

TITLE PAGE (56), References Cited, FOREIGN PATENT DOCUMENTS, add --PCT   WO97/00462A   1/1997--

TITLE PAGE (56), References Cited, OTHER PUBLICATIONS, add --Communication from Korean Patent Office re: counterpart application.--

Col. 1 Substitute Title: --ELECTROOPTIC DEVICE HAVING CONDUCTIVE SEAL MATERIAL AND PARTICULAR WIRING STRUCTURE, METHOD OF MANUFACTURING THE SAME, AND ELECTRONIC APPARATUS--

| | |
|---|---|
| Col. 9, line 20: | "lib" should be --11b-- |
| Col. 17, line 33: | "Ha" should be --11a-- |
| Col. 17, line 55: | "11 a" should be --11a-- |
| Col. 35, line 18: | "an electrode" should be --electrodes-- |

UNITED STATES PATENT AND TRADEMARK OFFICE
CERTIFICATE OF CORRECTION

PATENT NO. : 7,088,417 B2
APPLICATION NO. : 10/123079
DATED : August 8, 2006
INVENTOR(S) : Motohiro Kamijima et al.

It is certified that error appears in the above-identified patent and that said Letters Patent is hereby corrected as shown below:

| | |
|---|---|
| Col. 36, line 52: | "befin" should be --being-- |
| Col. 36, line 55: | "begin" should be --being-- |
| Col. 36, line 56: | "over lap" should be --overlap-- |
| Col. 36, line 60: | after "of", 2nd occurrence, insert --each-- |
| Col. 37, line 11: | after "of" insert --the-- |
| Col. 37, line 15: | "begin" should be --being-- |
| Col. 37, line 22: | "coprising:" should be --comprising:-- |
| Col. 37, line 38: | after "device" insert --according-- |
| Col. 38, line 32: | "wilder" should be --wider-- |

Signed and Sealed this

Sixth Day of May, 2008

JON W. DUDAS
*Director of the United States Patent and Trademark Office*